(12) United States Patent
Furst et al.

(10) Patent No.: US 7,899,196 B2
(45) Date of Patent: Mar. 1, 2011

(54) DIGITAL MICROPHONE

(75) Inventors: Claus Erdmann Furst, Roskilde (DK); Henrik Thomsen, Dyssegard (DK); Igor Mucha, Bratislava (SK)

(73) Assignee: Audioasics A/S, Roskilde (DK)

( * ) Notice: Subject to any disclaimer, the term of this patent is extended or adjusted under 35 U.S.C. 154(b) by 1203 days.

(21) Appl. No.: 10/597,552

(22) PCT Filed: Feb. 9, 2005

(86) PCT No.: PCT/DK2005/000086
§ 371 (c)(1),
(2), (4) Date: Sep. 13, 2006

(87) PCT Pub. No.: WO2005/076466
PCT Pub. Date: Aug. 18, 2005

(65) Prior Publication Data
US 2009/0316935 A1    Dec. 24, 2009

Related U.S. Application Data

(60) Provisional application No. 60/542,305, filed on Feb. 9, 2004.

(30) Foreign Application Priority Data

Oct. 6, 2004   (DK) ............................ PA 2004 01531

(51) Int. Cl.
*H04R 3/00*    (2006.01)
*H03M 3/00*    (2006.01)

(52) U.S. Cl. ......................................... 381/111; 341/143

(58) Field of Classification Search .................. 381/111, 381/121, 120, 122; 330/252, 253, 260, 297, 330/303, 306; 341/143, 155
See application file for complete search history.

(56) References Cited

U.S. PATENT DOCUMENTS

| | | | |
|---|---|---|---|
| 5,339,285 A | 8/1994 | Straw | |
| 5,357,214 A | 10/1994 | Heyl et al. | |
| 5,861,778 A | 1/1999 | Louagie et al. | |
| 6,104,821 A | 8/2000 | Husung et al. | |
| 6,160,450 A | 12/2000 | Eschauzier et al. | |
| 6,275,109 B1 * | 8/2001 | Tang | 330/261 |
| 6,516,069 B1 | 2/2003 | Takeuchi et al. | |
| 6,573,785 B1 * | 6/2003 | Callicotte et al. | 330/9 |
| 6,583,658 B1 | 6/2003 | Kern et al. | |
| 6,661,217 B2 * | 12/2003 | Kimball et al. | 324/76.41 |
| 2002/0106091 A1 | 8/2002 | Furst et al. | |
| 2003/0045252 A1 | 3/2003 | Nam | |
| 2003/0059060 A1 | 3/2003 | Eastty et al. | |
| 2003/0235315 A1 | 12/2003 | Reesor | |

FOREIGN PATENT DOCUMENTS

WO    WO-2005/003941    4/2005

* cited by examiner

*Primary Examiner* — Curtis Kuntz
*Assistant Examiner* — Hai Phan
(74) *Attorney, Agent, or Firm* — Kenyon & Kenyon LLP

(57) ABSTRACT

An integrated circuit, configured to process microphone signals, where the integrated circuit comprises: a preamplifier (306) with an amplifier section (301) which has a first input ($\phi$) and a second input ($\phi$*) and an output ($\phi$), and with a feedback filter network (Z1; Z1, Z1*, Z2) coupled between the output ($\phi$; $\phi$, $\phi$*) and the second input ($\phi$'); where the first input ($\phi$) to the amplifier section (301) has an input impedance which by means of the input impedance of the amplifier section is substantially isolated from the feedback network with respect to input impedance; and where the preamplifier has a frequency-gain transfer function which suppress low frequencies; and an analogue-to-digital converter coupled to receive an anti-aliasing filtered input signal and providing a digital output signal (Do).

20 Claims, 11 Drawing Sheets

DIGITAL MICROPHONE

CROSS REFERENCE TO PRIOR APPLICATION

The above-referenced application is a National Phase of International Patent Application of PCT/DK2005/000086 filed on Feb. 9, 2005, and claims the benefit of U.S. Provisional Application No. 60/542,305 filed Feb. 9, 2004 and Danish Patent Application No. PA 2004 01531, filed Oct. 6, 2004. The International Application was published on Aug. 18, 2005 as WO 2005/076466.

The present invention relates to an integrated circuit comprising a microphone preamplifier and an analogue-to-digital converter to provide a digital output signal. Additionally, it relates to a digital microphone comprising a microphone element and an integrated circuit as set forth above.

BACKGROUND

A sound pressure detected by the microphone element will cause its membrane to move and consequently change the capacitance of the capacitor formed by its membrane and a so-called back plate of the microphone element. When the charge on the capacitor formed by these two members is kept constant, the voltage across the two capacitor members will change with the sound pressure acting on the membrane. As the charge on the microphone capacitor has to be kept constant to maintain proportionality between sound pressure and voltage across the capacitor members, it is important not to load the microphone capacitance with a resistive load. A resistive load will discharge the capacitor and thereby degrade or ruin the capacitor's performance as a microphone.

Therefore, in order to pick up a microphone signal from the capacitor, amplifiers configured with the primary objective of providing high input resistance are preferred in order to buffer the capacitor from circuits which are optimized for other objectives. The amplifier connected to pick up the microphone signal is typically denoted a preamplifier or a buffer amplifier or simply a buffer. The preamplifier is typically connected physically very close to the capacitor—within a distance of very few millimeters or fractions of millimeters.

For small sized microphones the active capacitance is very small (typically 1 to 10 pF). This further increases the requirement of high input resistance and capacitance. Consequently, the input resistance of preamplifiers for small sized microphones has to be extremely high—in the magnitude of Giga ohms. Additionally, the input capacitance of this amplifier has to be very small in order to achieve a fair sensitivity to sound pressure.

Especially so-called telecom microphones with an integrated preamplifier are sold in high volumes and at very low prices. As cost of an amplifier for a telecom microphone is directly related to the size of the preamplifier chip die it is important, for the purpose of reducing price, that the preamplifier chip die is as small as possible. Therefore extraordinary attention is drawn to compact circuits and such circuits are in very high demand. However, it is important in this respect to provide circuits with a low noise level. Low noise is important as noise can be traded for area—i.e. if the circuit has low noise and a noise lower than required, this noise level can be traded for lower chip die area and it is thus possible to manufacture the preamplifier at lower cost.

When designing a preamplifier in CMOS technology for a microphone there is normally three noise sources. These sources are noise from a bias resistor, 1/f noise from an input transistor, and white noise from the input transistor. We assume that input transistor noise dominates. Both white noise and 1/f noise can be minimized by optimizing the length and the width of the input transistor(s). This applies for any input stage e.g. a single transistor stage or a differential stage. The noise from the bias resistor can also be minimized. If the bias resistor is made very large then the noise from the resistor will be high-pass filtered and the in-band noise will be very low. This has the effect though that the lower bandwidth limit of the amplifier will be very low. This can be a problem as the input of the amplifier will settle at a nominal value only after a very long period of time after power up. Additionally, signals with intensive low frequency content arising form eg slamming of a door or infra sound in a car can overload the amplifier. Another related problem is small leakage currents originating from mounting of the die inside a microphone module. Such currents will due to the extreme input impedance establish a DC offset. This will reduce the overload margin of the amplifier.

In addition to the above there is a demand for digital microphones comprising a microphone element and an integrated circuit with a preamplifier and an analogue-to-digital converter to provide a digital output signal. Since typically a telecom microphone is integrated in a consumer electronics device where a substantial amount of digital signal processing is performed by a mainly digital integrated circuit chips it is in general preferred that signals from sensors (such as microphones) are provided as digital signals. This introduces new challenges in respect of signal processing in the integrated circuits embedded with the microphones—and especially in respect of distortion in the digital domain.

In recent years so-called sigma-delta modulators have become very popular for implementing A/D converters. They exhibit many virtues, which among others are: no need for high precision components; high linearity; and for so-called single loop modulators also the advantages of small die area, low voltage operation and possibly very low power consumption. These are advantages which makes sigma delta modulators very suitable for single chip implementations.

A special class of sigma delta modulators are 1-bit quantized sigma delta modulators. This type of modulators are especially suited for low cost implementations as the complexity of the analogue part of the A/D converter is minimal compared to other types of A/D converters. A complete 1-bit sigma delta converter consists of a 1-bit analogue sigma delta modulator and a digital decimation filter only. The normally required higher order anti-aliasing filter can be implemented by a simple RC-filter. This is due to the fact that heavy over-sampling is used and thus the digital decimation filter performs the job of anti-aliasing filtering.

1-bit sigma delta modulators are very simple to implement in the analogue domain. Thus they are very suitable for low cost miniature digital microphones. Unfortunately they do also have disadvantages. Especially 1-bit sigma delta modulators exhibit the so called idle mode tones, which are low level tones in the audio band caused by low frequency or DC levels at the input of the modulator. This is the reason why 1-bit sigma delta modulators has been abandoned by many despite of its many virtues. One can use dither to remove this problem or design chaotic modulators: but all of these solutions has the effect that the complexity of the design increases dramatically. Thus both power consumption and die area increases dramatically.

This idle-mode-tones effect has caused sigma delta modulators less suitable for high quality audio applications. Apparently, this may seem to be of little concern in consumer/telecom applications. But as the demand for low cost digital microphones increases higher demands of performance, which may almost equal the performance of high quality audio, will follow. Consequently, the idle-mode-tones effect will become an increasing problem also for telecom applications.

In order to achieve high performance from the digital microphone, the preamplifier of the digital microphone ASIC has to have as high performance as possible i.e. low noise, low distortion, high dynamic range etc. According to presently available technology, CMOS technology is a prerequisite to achieve low noise performance and it can be shown that the input stage of the amplifier can be optimized in respect to noise. Also the input impedance should be as large as possible in order to minimize the noise. This is especially dominant for new and thinner types of telecom microphones which has a much lower sensitivity and cartridge capacitance than previously experienced.

Unfortunately this has the consequence that the preamplifier becomes capable of amplifying low frequency signals arising from the sound pressure of a door slamming, car rumbling or just changes in sensitivity of the microphone element due to humidity changes. This adds to the above explained problem of idle tone modes if a 1-bit sigma delta modulator is used. In fact also 2-bit and modulators with even more levels will exhibit such behaviour when exposed to such low frequency signals.

Additionally, these low frequency signals reduces the dynamic range and creates inter-modulation distortion as the low frequency signals can be excessive in amplitude.

The problem is worsened as the telecom microphones are becoming smaller and thinner and thus more gain is required from the preamplifier. However, normally the disturbing low frequency signals do not become smaller in amplitude. Thus the relative effect of the disturbance will increase.

So there is a need for a configuration of a preamplifier and an A/D converter which is suited for thin ECM cartridges with a very low cartridge sensitivity and capacitance. Additionally, the configuration should provide a very high performance on noise, dynamic range and distortion. Moreover, it shall be feasible to implement the configuration on a single chip die with a very small area in combination with few or none external components.

In the below description, the term audio band is used. In the prior art this term have various definitions depending on its context. However, in the below it will be used to designate a frequency band which typically has a lower corner frequency of 20 Hz to 500 Hz and an upper corner frequency of 5 KHz to 25 KHz. The specific definition of the band represents a design criterion, but for the below description it should be read with this broad definition.

RELATED ART

A so-called two stage preamplifier configuration, in which a simple buffer amplifier is followed by filter, has two disadvantages: as it has two stages, it is noisier and because there is no gain in the first stage the physical size of the filter has to be relatively large. The size of the filter could be minimized by increasing the gain of the first stage, but the amplifier would be sensitive to overload because of low frequency components which are not diminished until in the subsequent filter. Thus such a solution, originally developed for hearing aid microphones, will be far from optimal for new high sensitive telecom microphones. The area of the amplifier die would simply be too large and the device consequently too costly.

Since, the chip area occupied by the preamplifier must be as small as possible to obtain relatively low cost, the preamplifier must be as small as possible. Therefore, since amplifier configurations known from hearing aids are generally not optimised for chip area to the same extent as telecom microphones, these configurations are not applicable for telecom applications. Further, one should bear in mind that buffers or amplifiers applied in hearing aids are not configured to provide such high gain levels as are required for the low-sensitivity microphones used in telecommunication applications.

U.S. Pat. No. 6,583,658-B1 discloses a balanced circuit arrangement for converting an analogous input signal from a first terminal of a capacitor microphone into a symmetrical output signal. A first operational amplifier is coupled as a voltage follower and its output is provided as a first output signal of the symmetrical output signal. A second terminal of the capacitor microphone is coupled directly to the output of a second operational amplifier, which thereby provides a second output signal of the symmetrical output signal. The second operational amplifier's non-inverting input is coupled to a ground reference whereas its inverting input is coupled to a voltage divider which provides a voltage midway between the second and first output signal. The symmetrical output signal is provided to an analogue-to-digital converter of the sigma-delta type which provides a binary output signal.

The disclosed configuration is expedient in that relatively high voltage levels from the capacitor microphone can be handled while providing low noise. However, the capacitor microphone in combination with the input impedance of the amplifier will form a filter with only a very slowly decaying impulse response. When the microphone is exposed to transient sounds with large amplitude or low-frequent signals this in turn will generate very slowly varying signal components which are input to the analogue-to-digital converter of the sigma-delta type. In the sigma-delta type analogue-to-digital converter the signal components will generate so-called idle mode tones in the binary output signal. Further, the configuration is sensitive to overload caused by a largely uneven distribution of the signal spectrum generated by the microphone.

US 2002/0106091-A1 discloses a microphone unit with an internal analogue-to-digital converter. The unit comprises a sound transducer (a capacitor microphone with an electret member), a pre-amplifier coupled at its input to the sound transducer and at its output coupled to provide a signal input to the analogue-to-digital converter. A high-pass filter situated between the pre-amplifier and the analogue-to-digital converter is configured to block DC signals and reduce the noise level. Additionally, a low-pass filter is configured as an anti-aliasing filter which is situated between the pre-amplifier and the analogue-to-digital converter.

Although this configuration addresses important signal processing aspects, basic, but key implementation problems related to performance in terms of cost and noise are left unsolved. The disclosed configuration involves several signal processing stages. Each contributes to increasing the noise level. Additionally, the several stages occupy a large chip area which implies higher costs. Further, the configuration is sensitive to overload caused by a largely uneven distribution of the signal spectrum generated by the microphone.

U.S. Pat. No. 5,339,285 discloses a preamplifier for a piezoelectric sensor. The preamplifier is configured as a fully differential amplifier with its inputs coupled to the piezoelectric sensor and its outputs coupled to e.g. an analogue-to-digital converter. The preamplifier comprises a common-mode filter feedback configuration that in combination with the capacitance of the sensor realizes a high-pass filter integrated with the pre-amplifier. This configuration is small in size, it has relatively low noise and its differential configuration makes e.g. silicon substrate noise (when the pre-amplifier is implemented on chip) appear as a common-mode signal which can be removed subsequently. However, this configuration is not suitable since the gain of the amplifier is dependent on the microphone. Further, noise of the preamplifier cannot be optimized independently of the microphone element.

SUMMARY OF THE INVENTION

Thus, it is an objective of the present invention to provide a preamplifier with the lowest possible input capacitance, lowest possible noise, largest output signal swing and at the same time exhibiting the lowest smallest possible chip area.

It is an objective of the present invention to provide a preamplifier having a large power supply rejection and low distortion.

It is an objective of the present invention to provide an amplifier which is able to handle slowly varying signals with relatively large amplitude at its input terminal while at the same time being able to amplify a low level signal with a higher frequency with low distortion.

It is an objective of the present invention to provide an amplifier which performance is very insensitive towards leakage and parasitic couplings connected to the input.

Additionally it is an objective to provide a digital output signal with low distortion.

Further, it is an objective to provide a preamplifier configuration which can be optimized independently of the microphone circuit.

There is provided an integrated circuit, configured to process microphone signals, where the integrated circuit comprises: a preamplifier with an amplifier section which has a first input and a second input and an output, and with a feedback filter network coupled between the output and the second input. The first input to the amplifier section has an input impedance which by means of the input impedance of the amplifier section is substantially isolated from the feedback network with respect to input impedance; and the preamplifier has a frequency-gain transfer function which suppress low frequencies. Additionally it comprises an analogue-to-digital converter coupled to receive an anti-aliasing filtered input signal and providing a digital output signal.

The anti-aliasing filtered input signal is provided either by an anti-aliasing filter coupled to receive the output signal from the preamplifier or it is provided as a result of the frequency-gain transfer function being configured as a band-pass filter where its upper stop-band prevents anti-aliasing.

Irrespective of the implementation of the anti-aliasing, the preamplifier is configured to provide a determined frequency-gain transfer function, which remains substantially unchanged irrespective of the frequency-impedance characteristic of a microphone circuit that is coupled to provide an input signal to the preamplifier. This is an important improvement since often the design of the preamplifier and the microphone circuit, with the microphone element itself, yields contradictions. Especially, since the microphone element is a mechanical component and often more difficult to control with respect to its electrical properties, the independence of the microphone element on the frequency-gain transfer function is expedient. This applies both for condenser microphone elements which are located as a unit separate from the chip carrying the integrated circuit and for MEMS microphone elements which are located as a micro mechanical portion of the MEMS device. Since the preamplifier typically has a differential input stage (of an operational amplifier) a large high impedance is realized. This high input impedance is not destroyed by the feedback filter, and consequently the amplifier does not load the microphone circuit.

Further, inter-modulation distortion introduced by frequency components at low frequencies, outside the audio band, will be very low. The loop-gain characteristic provided by the feed-back configuration provides among other things lower distortion.

It should be noted that the preamplifier can be embodied as a single-ended amplifier or as a differential amplifier or a differential difference amplifier or other amplifier with several inputs and outputs.

However, in preferred embodiments the preamplifier is configured as a differential amplifier. Thus, expediently the preamplifier is configured to provide a differential output signal by a first and a second amplifier section, where the preamplifier has a differential mode transfer function which comprises a band-pass characteristic. The preamplifier comprises a feedback filter network which establishes filter feedback paths which couple outputs to respective inverting inputs of the amplifier sections and establishes a filter interconnection path, which interconnects the inverting inputs.

The differential configuration of the preamplifier provides generally a large common-mode rejection ratio and a very high input impedance. Due to the configuration of the feedback filter simple circuit control of the frequency-gain transfer function is achieved. Thereby, the transfer function can be trimmed or manipulated with a larger degree of freedom. Further, the differential configuration and the feedback filter in combination allows for utilizing the common-mode rejection ratio in a frequency dependent way.

Preferably, a lower cut-off frequency of the filter realized by the preamplifier is located below the lower corner frequency of an audio band. Thereby, an expedient compromise between a downwardly broad audio band and a sufficiently short decay time of the impulse response of the microphone circuit and the preamplifier in combination is achieved. The short decay time of the impulse response is expedient in that the effect of low frequent pulses, be it either from sound pulses or electrical disturbances, is reduced. Otherwise such low frequent pulses could overload the amplifier and subsequent signal processing circuits and hence generate unpleasant non-linear distortion. In an expedient embodiment, the cut-off frequency is located about 10 Hz.

Expediently, the preamplifier has a differential mode transfer function which comprises a band-pass characteristic with an upper cut-off frequency located below half the sampling frequency of the analogue-to-digital converter. Thereby an efficient implementation, with respect to chip area, of an anti-aliasing filter is provided by the preamplifier. For instance the sampling frequency may be about 2.4 MHz and an upper cut-off frequency of about 40-70 KHz may be chosen. Further, circuit control of the cut-off frequency, which may coincide with the band limit of the amplifier sections themselves, is introduced.

In an embodiment, the preamplifier has a differential mode transfer function which comprises a band-pass characteristic, which has a nominal pass-band and a gain plateau band, where the nominal pass-band extends over audio band frequencies and where the gain plateau band extends over frequencies above the audio band up to an upper cut-off frequency. Thereby, noise components, arising from either acoustic/mechanical sources or electrical sources, located above the audio band is damped. Thereby it is possible to safeguard the preamplifier from being overloaded by noise signals and gain/amplitude effects of a resonance peak of the microphone circuit. Such a peak may have an amplitude of e.g. about 6 dB.

The preamplifier can have a common-mode transfer function which comprises a low-pass characteristic. Thereby, it is possible to set the common-mode DC output level of the preamplifier at the input of the preamplifier, while the common-mode rejection ratio at audio band frequencies is utilized. Since the input impedance of the preamplifier is very high it is possible to set the DC input level via a pull-up resistor with a very high ohmic impedance (e.g. 1-20 GOhm implemented e.g. by CMOS transistors in their weak inversion mode and in linear region) which will not load the microphone circuit substantially.

Further, the preamplifier can have a common-mode transfer function which comprises a stop-band characteristic, and where a flat gain response is provided for low frequencies. Thereby, the DC input setting is preserved while the preamplifier acts to provide a common-mode signal at two frequency bands: at low frequencies (below the audio band) and at high frequencies (above the audio band). Thereby efficient damping of undesired frequency components, with respect to audio sound reproduction, is achieved. The stop-band will encompass the audio band.

In an embodiment, the preamplifier has a common-mode transfer function and a differential mode transfer function where the preamplifier is configured such that its common-mode gain prevails at low frequencies, whereas its differential mode gain prevails at audio band frequencies.

Further, the common-mode gain may prevail at frequencies above an upper cut-off frequency of the band-pass characteristic.

In an expedient embodiment, a phase-shifter is cross-coupled between the output of a first amplifier section and an input of a second amplifier section. This is an efficient configuration which ensures that the second amplifier section operates at or close to 180 degrees out of phase with the first amplifier section when a dominating differential mode gain is desired e.g. at audio band frequencies. Additionally, the phase-shifter may be configured to control the DC level of input to the second amplifier section. This is achieved when the phase-shifter comprises a resistive path between the input and output of the respective amplifiers.

Alternatively, or additionally, a phase-shifter is coupled between respective inputs of the respective amplifier sections. This configuration is also capable of providing the 180 degrees phase shift and optionally the DC level of input to the second amplifier section.

Preferably, the preamplifier comprises a DC off-set circuit integrated with the feedback filter to provide a DC shift at the output of the preamplifier. This integration can be provided by a voltage divider coupled to a AC feedback resistor where the voltage divider has substantial lower impedance than the AC feedback resistor e.g. lower by a factor of about ⅕, ⅛ or ¹⁄₁₀. Alternatively, the DC shift can be implemented by active current sources.

Further, a DC off-set circuit can be integrated with the feedback filter to provide a differential mode DC shift at the output of the preamplifier. The differential mode DC shift is determined by a difference in DC off-sets provided by first and second off-set circuit. Thereby so-called idle mode tones of the analogue-to-digital converter of the sigma-delta modulator type can be controlled. The location of the idle mode tone is proportional to the differential mode DC shift (and a constant determined by a sampler of the sigma-delta modulator and half of the sampling frequency).

Preferably, the analogue-to-digital converter comprises a sigma-delta modulator. The sigma-delta modulator provides noise power spectrum which (in practical implementations) is distributed with a flat and relatively low noise floor for lower frequencies, but with an increasing noise level above a corner frequency. Since heavy over-sampling is applied the corner frequency appears well above the audio band. Expediently, the modulator provides a serial output signal.

The sigma-delta modulator may comprise a switch-capacitor sampler, which samples the differential signal provided by the preamplifier to provide a single ended input signal for the sigma-delta A/D conversion, and samples a DC voltage level such that the single ended input signal is superimposed on the sampled DC voltage level. This provides for easier optimization of sigma-delta modulator since idle-mode tone control takes place in the modulator. Since the sampler (and control of it) is already available for sampling the signal from the preamplifier the sampling of the DC level can be achieved with only a slightly added complexity. Further, the preamplifier is not loaded with common-mode DC overhead which ultimately reduces output AC swing.

Preferably, the sampler comprises a summing amplifier which is an integrated portion of the sampler and the sigma-delta modulator loop. The sigma-delta modulator loop is well-known to a person skilled in the art, but for completeness, it comprises an integrator filter of a given order which is coupled to provide an integrated error signal to a quantizer that quantifies the signal into discrete levels e.g. two, three or four levels.

Further, the summing amplifier may be provided with an integration error feedback signal of the sigma-delta modulator via a first series capacitor and the DC voltage level is provided to the summing amplifier via a second series capacitor. Thereby the idle mode tones can be controlled by the ratio between the values of the first and second series capacitor. The location of the idle mode tone is determined by the expression $$F_{idle} = (V_{DC\,offset\,\Sigma\Delta} / V_{REF\,\Sigma\Delta}) * (C_{S1}/C_{S2}) * \tfrac{1}{2} F_S$$

where $F_{idle}$ is the location of the idle mode tone, $C_{S1}$ and $C_{S2}$ are the values of the first and second capacitor, $F_S$ is the sampling frequency, $V_{DC\,offset\,\Sigma\Delta}$ is the sampled DC voltage and $V_{REF\,\Sigma\Delta}$ is an internal reference of quantizer in the sigma-delta modulator.

When the analogue-to-digital converter comprises a sigma-delta modulator, and when a DC off-set voltage level input to the sigma-delta modulator is chosen such that a low-frequent pulse input to and processed by the preamplifier provides idle-mode tones above the audio band, a substantial reduction of non-linear distortion in a digital microphone is achieved. The DC off-set voltage level is provided by the preamplifier as a differential mode DC signal or by the sampler as described above. The temporal duration of the pulse response of the combination of the microphone circuit and the preamplifier is limited by the high-pass filter function of the preamplifier, this further reduces the sensitivity to generation of idle mode tones.

Additionally, there is provided a microphone comprising an integrated circuit as set forth in the above and a condenser microphone element configured to provide a microphone signal, responsive to a sound pressure on the microphone element, to the input of the microphone preamplifier. The condenser microphone element may be a microphone with an electret layer (i.e. an electret condenser microphone, ECM) or a DC biased condenser microphone.

Moreover, there is provided a microphone comprising an integrated circuit as set forth in the above and a Micro Electro Mechanical System, MEMS, microphone element to provide a microphone signal, responsive to a sound pressure on the MEMS microphone element, to the microphone preamplifier.

BRIEF DESCRIPTION OF THE DRAWING

The invention will be described in more detail and with reference to a preferred embodiment, in which.

DETAILED DESCRIPTION

Figure 1:
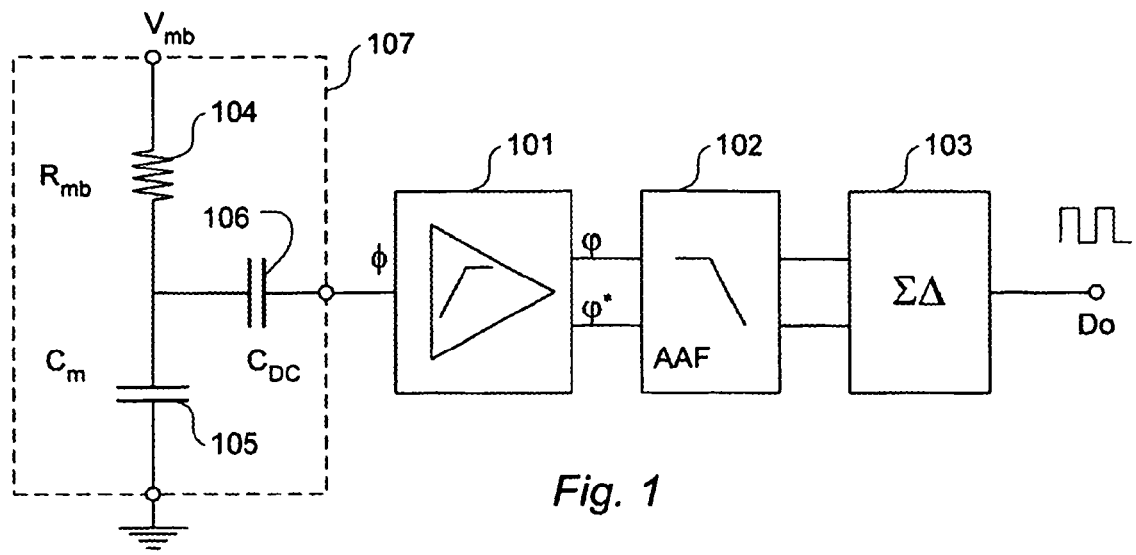
FIG. 1 shows a digital microphone comprising a microphone element, a preamplifier with a high-pass filter function, an anti-aliasing filter and an analogue-to-digital converter.

FIG. 1 shows a digital microphone comprising a microphone element, a preamplifier with a high-pass filter function, an anti-aliasing filter and an analogue-to-digital converter. The microphone element Cm, 105 comprises a first member in the form of a membrane or diaphragm that moves in response to a sound pressure acting on the membrane. The membrane moves relative to a second member typically a so-called back plate or simply a microphone casing which also serves for holding the movable membrane. One of the members, typically the second member is coupled to a ground reference whereas the other member, typically the membrane, is biased via a bias resistor $R_{mb}$, 104 that is coupled to a DC bias voltage $V_{mb}$. Thereby an electrical charge is provided on the membrane or movable member of the microphone element 105, Cm. Since the amount of charge is kept constant (for very low frequencies and up), an electrical microphone signal is provided by the membrane when it moves in response to a sound pressure acting on it. The microphone signal caused by the movements of the membrane is superposed on a DC signal caused by the biasing. The circuit comprising the microphone element 105, the bias resistor 104 and the DC blocking capacitor is comprised by the microphone circuit 107.

The microphone signal is provided to the input, φ, of a preamplifier 101 via a DC blocking capacitor 106 which prevents the DC bias signal from reaching the input of the preamplifier.

The preamplifier 101 is characterised by having a high-pass gain characteristic with relatively low gain for frequencies below the audio band and a relatively high gain for frequencies in the audio band. Preferably, the gain characteristic descents as a $1^{st}$, $2^{nd}$, $3^{rd}$, $4^{th}$ or higher order below the audio band. Preferably the low-pass gain characteristic has a cut-off frequency of about 10 Hz. In addition thereto the amplifier is characterised by processing a low frequency microphone signal as a common-mode signal and a high frequency microphone signal as a differential mode signal. Thereby low frequency components are effectively suppressed. For an audio band with a lower corner frequency of 20 Hz, low frequencies are frequencies below about 5-20 Hz and higher frequencies are frequencies above 10-30 Hz.

Output of the preamplifier 101 is provided as a differential signal at output ports, φ and φ*, to a sigma-delta A/D converter 103 via an anti-aliasing filter, AAF, 102. The sigma-delta converter provides an over-sampled 1-bit output signal designated Do. The sigma-delta converter operates at a sampling frequency of about 2.4 MHz or greater.

The digital microphone of FIG. 1 may be exposed to sounds that occur in its environment with a relatively large amplitude and with a relatively steep amplitude slope rate in the time-domain. Such sounds may originate from slamming a car door, dropping the telecom device on a table etc. and will generate input signals which comprise low-frequent signals with a large amplitude. When the microphone is connected to its power supply the electrical circuit of the microphone will be exposed to a step-like power supply pulse. This is also denoted a start-up or power-up pulse and it will likewise generate a signal comprising low-frequent (input) signals with a large amplitude.

In the analogue domain the bias resistor $R_{mb}$ and the capacitance of the microphone element forms a high-pass filter with an impulse response that has a relatively short attack time, but a relatively long decay time. Consequently, a very low frequent pulse (considered almost DC) stays on at the input of the preamplifier. Unless this impulse response is modified, a severe distortion of the microphone's output signal in the digital domain is the consequence.

In the analogue domain noise considerations make it generally desired to design the bias resistor Rmb to have a large ohmic value e.g. in the order of several hundred mega Ohms to Giga or Tera Ohms. A typical capacitance value of the microphone generates in combination with the large bias resistor a lower cut-off frequency of about 0.01 Hz. This corresponds to a decay time of the impulse response which is in the order of several minutes. Thereby a large sound impulse generates a DC potential at the input of the preamplifier which decays, but prevails for several minutes. Further, since the preamplifier provides a gain above 0 dB e.g. 6 dB this gain would establish an even higher DC level at the output of the amplifier if it was not for the high-pass filter function of the preamplifier.

The high-pass filter function of the preamplifier introduces a lower cut-off frequency of about 10 Hz. This filter of the preamplifier makes the combined impulse response of the microphone element and the preamplifier decaying faster—typically faster than 0.5 seconds. Thereby, the input of the sigma-delta converter is not exposed to a slowly decaying DC level, but only to fast decaying impulses.

The sigma-delta converter provides an output signal, $D_O$, in the digital domain. This output signal has a power spectrum which comprises a flat noise floor. Above a noise corner frequency the noise level gradually increases with higher frequencies. The nature of the sigma-delta converter makes the converter sensitive to the DC level of the low frequent signals described above in that dominant tones occur in power spectrum of the digital output signal. These tones give a severe distortion of the reproduction of the sound signal in the digital output signal. These idle mode tones must be controlled to provide good sound reproduction in the digital domain.

Figure 2:
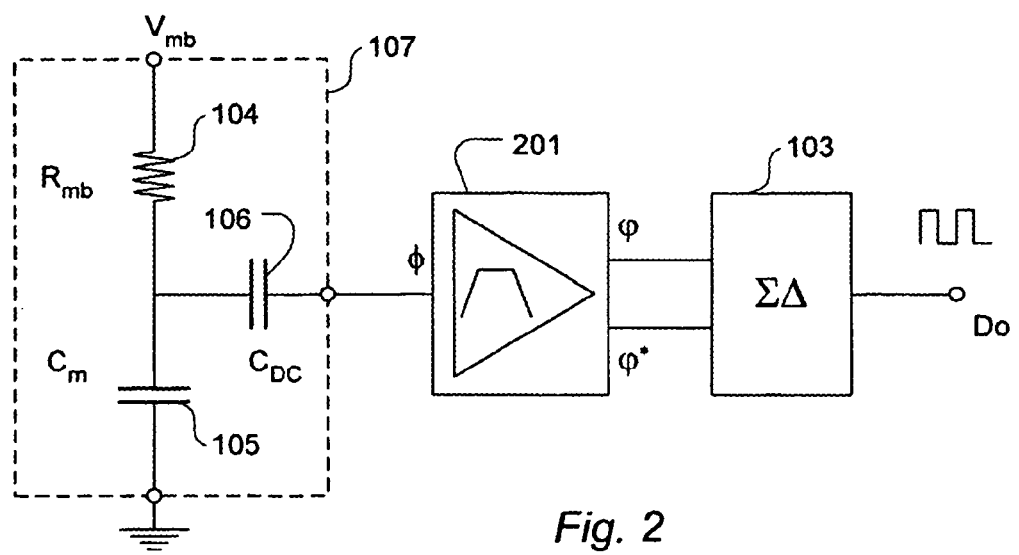
FIG. 2 shows a digital microphone comprising a microphone element, a preamplifier with an integrated band-pass filter function and an analogue-to-digital converter.

FIG. 2 shows a digital microphone comprising a microphone element, a preamplifier with an integrated band-pass filter function and an analogue-to-digital converter. The microphone element 105 is comprised by the microphone circuit 107 and operates as described above.

The preamplifier 201 is configured as a band-pass filter providing a gain of more than 0 dB in its pass-band. The pass-band has a lower cut-off frequency of about 10 Hz and an upper cut-off frequency located below half the sampling frequency of the sigma-delta converter 103. For a sampling frequency, $f_s$, of about 2.4 MHz the upper cut-off frequency is e.g. 40-70 KHz.

Thus, the preamplifier is characterised by having a frequency-gain characteristic with a relatively low gain for frequencies below the audio band, a relatively high gain for frequencies in the audio band, and a relatively low gain for frequencies above the audio band. Preferably, the frequency-gain characteristic descents as a $1^{st}$, $2^{nd}$, $3^{rd}$, $4^{th}$, or higher order below and above the audible range. In addition thereto the preamplifier is characterised by processing a low frequency microphone signal as a common-mode signal and a high frequency microphone signal as a differential mode signal. Thereby low frequency components are effectively suppressed. Thus, the preamplifier implements a band-pass filter. In the following, the preamplifier is also designated a differential preamplifier.

The function of the band-pass filter amplifier is to suppress signals at frequencies below the pass-band ie the audio band to avoid overload of the input stage of the differential amplifier and to suppress frequencies above approximately half the Nyquest frequency to avoid aliasing problems in subsequent sampling and digitalizing of the signal output from the band-pass filter amplifier. Thereby, a separate anti-aliasing filter can be avoided.

Figure 3:
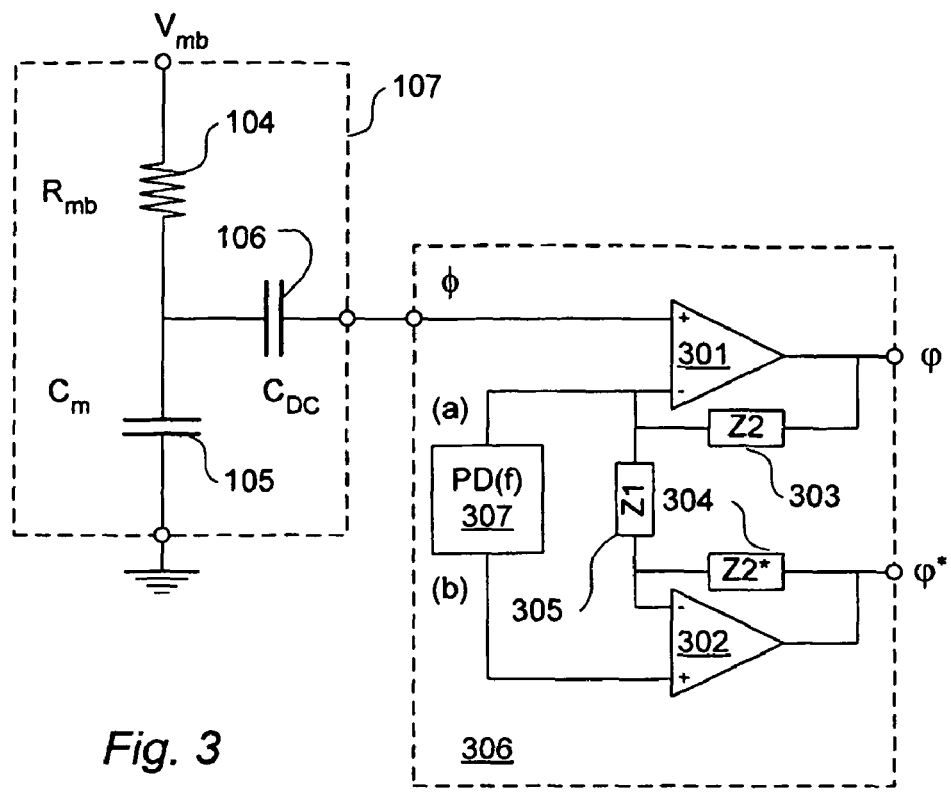
FIG. 3 shows a microphone comprising a differential preamplifier with a filter function and a phase-shifter in a first configuration.

FIG. 3 shows a microphone comprising a differential preamplifier with a filter function and a phase-shifter in a first configuration. The differential preamplifier 306 is shown with an input terminal, φ, and output terminals φ and φ*. The preamplifier is connected to the microphone circuit 107 wherefrom it receives a microphone signal at its input terminal, φ.

The preamplifier is configured as an instrumentation-like amplifier with a filter feedback network comprised by the impedances Z1, Z2 and Z2* designated 305, 303 and 304 and with a phase-shifter network 307. The impedance Z2, 303 is coupled between the output terminal φ and the inverting input of the operational amplifier 301. The impedance Z2*, 304 is coupled as a like feedback for the operational amplifier 302. The impedance Z1 is coupled between the inverting and non-inverting input of amplifiers 301 and 302, respectively. The filter feedback network establishes a high-pass filter function or a band-pass filter function of the differential preamplifier in its differential mode. The impedances Z1, Z2, and Z2* are implemented by components, available for chip implementation, which provides a capacitive or resistive behaviour or a combination thereof.

The phase-shifter network PD(f), 307 has an input port designated (a) and an output port designated (b). The input port (a) is coupled to the inverting input of the first operational amplifier 301 and the output port (b) is coupled to the inverting input of the second operational amplifier 302. The phase-shifter network realizes a frequency dependent phase shift shifting the phase about ±180 degrees at high frequencies and about 0 degrees at low frequencies. Thereby it is ensured that the differential mode output signal behaves as a common mode signal at low frequencies whereas it behaves as a true differential mode signal at high frequencies. This phase shift provides an efficient high-pass filtering since the output signal is forced to be a common mode signal at low frequencies, but only at low frequencies.

This configuration of the preamplifier is expedient in that the input of the phase-shifter is coupled to the input of the preamplifier via the inverting input of operational amplifier 301.

In an alternative configuration however, the input of the phase-shifter is coupled to the circuit node established between the microphone block 107 and the input of the preamplifier (at the non-inverting input of the operational amplifier 301.

It should be noted that the feedback filters can be implemented by means of active filters and/or an active DC servo.

Figure 4:
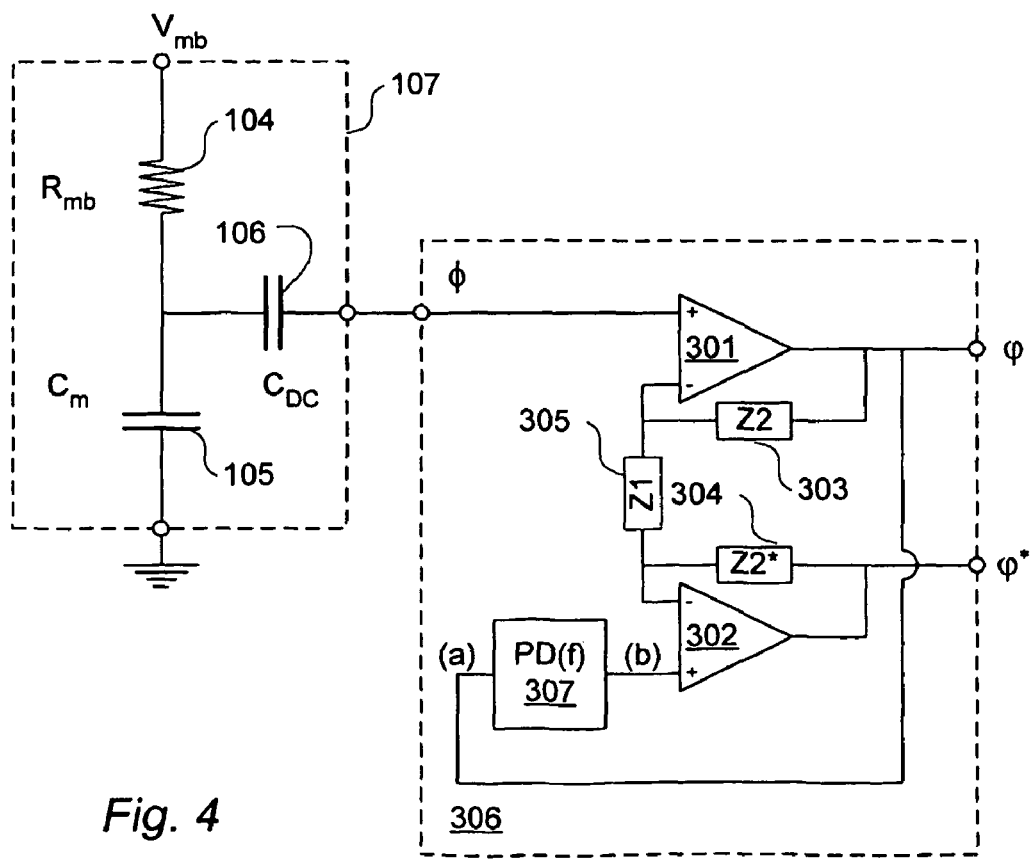
FIG. 4 shows a microphone comprising a differential preamplifier with a filter function and a phase-shifter in a second configuration.

FIG. 4 shows a microphone comprising a differential preamplifier with a filter function and a phase-shifter in a second configuration. This configuration corresponds closely to the one shown in FIG. 3, but the phase-shifter 307 is coupled between the output terminal of the first operational amplifier 301 and the non-inverting input terminal of the second operational amplifier.

Thus, the phase-shifter 307 shown in FIGS. 3 and 4 and as described in the above is cross-coupled between the two common mode amplifiers of the differential preamplifier.

The amplifiers 301 and 302 are generally also designated amplifier sections since they may comprise several amplifier stages.

Figure 5:
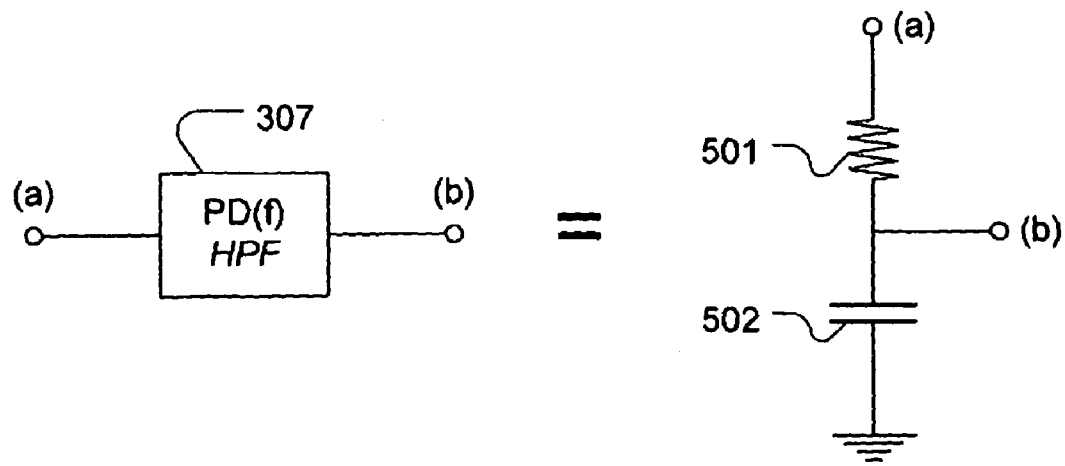
FIG. 5 shows a first phase-shifter.

FIG. 5 shows a first phase-shifter. The phase-shifter 307 is realized in combination with an operational amplifier to establish a first order low-pass filter which provides a phase shift of about 0 degrees at low frequencies and about 180 degrees at high frequencies.

The phase-shifter 307 forces the outputs, φ and φ*, of the preamplifier to act in common-mode at low frequencies and in differential mode at higher frequencies. Thereby, the preamplifier, with the phase-shifter, network provides an efficient differential-mode suppression of low frequencies. Preferably, the cut-off frequency of this differential mode high-pass filter is located about 10 Hz, but it could be located in the range up to about 30 or 50 Hz.

Figure 6:
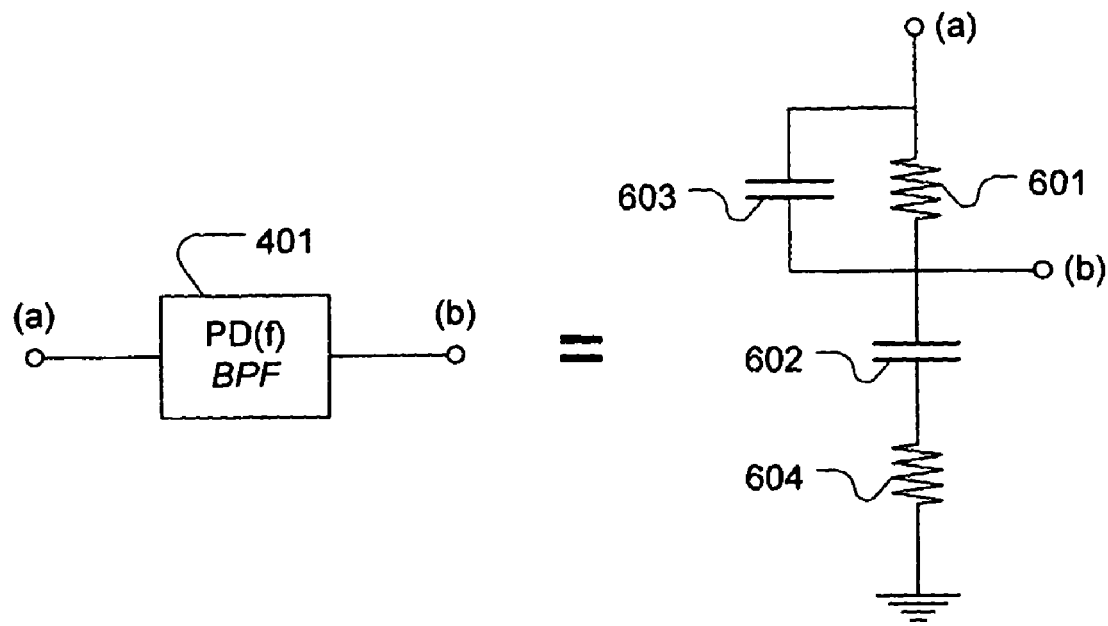
FIG. 6 shows a second phase-shifter.

FIG. 6 shows a second phase-shifter. In this embodiment, the phase-shifter 401 is realized in combination with an operational amplifier to establish a band-pass filter which provides a phase shift of about 0 degrees at low frequencies, about 180 degrees at intermediate frequencies and about 0 degrees at higher frequencies. Intermediate frequencies are defined as frequencies comprising the audio band and frequencies up to an upper cut-off frequency of a band-pass filter. The upper cut-off frequency is typically designed to be located about the pole which is introduced by the operational amplifiers. Frequencies above this upper cut-off frequency is denoted higher frequencies.

The phase-shifter 401 forces the outputs, φ and φ*, of the preamplifier to act in common-mode at low frequencies and at higher frequencies. At intermediate frequencies the phase-shifter allows the preamplifier to act in differential mode.

Thereby, the preamplifier, with the phase-shifter, network provides an efficient differential-mode suppression of low frequencies and high frequencies. Thereby, an efficient anti-aliasing filter is additionally provided.

The phase-shifter comprises a capacitor 603 and a resistor 601 coupled in parallel and forming a signal path between the input port (a) and the output port (b). A series connection of a capacitor 602 and a resistor 604 provides a signal path between the output port (b) and ground.

The phase-shifter PD(f), irrespective of whether it is implemented as a first order or second order or higher order phase-shifter, ensures that the differential mode gain at low and high frequencies, but not intermediate frequencies, is very low. The phase-shifter provides such a very low gain by introducing at least one zero at 0 Hz (DC) and a pole, at a frequency above the audio band, in the transfer function of the preamplifier filter.

Figure 7:
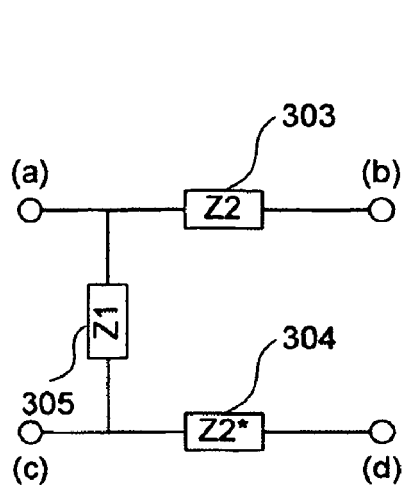
FIG. 7 shows a shows a four-port high-pass feedback network providing in an amplifier a low-pass filter function.
Figure 7:
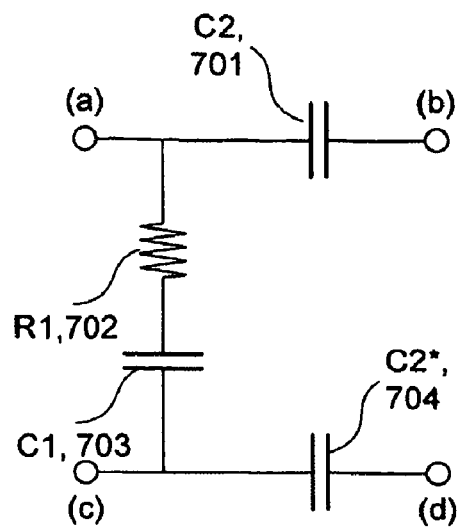

FIG. 7 shows a four-port high-pass feedback network providing in an amplifier a low-pass filter function. The feedback network comprises ports (a), (b), (c) and (d). Feedback paths from (b) to (a) and from (d) to (c) are established by capacitors C2, 701 and C2*, 704, respectively.

Between the ports (a) and (c) a series connection of a capacitor and a resistor is established by C1, 703 and R1, 702. This series connection connects the inputs of the amplifier sections 301 and 302.

Figure 8:
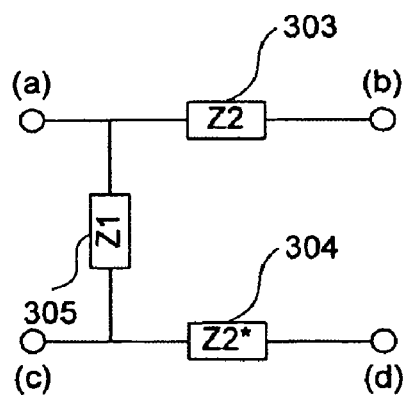
FIG. 8 shows a four-port band-stop feedback network providing in an amplifier a band-pass filter function.
Figure 8:
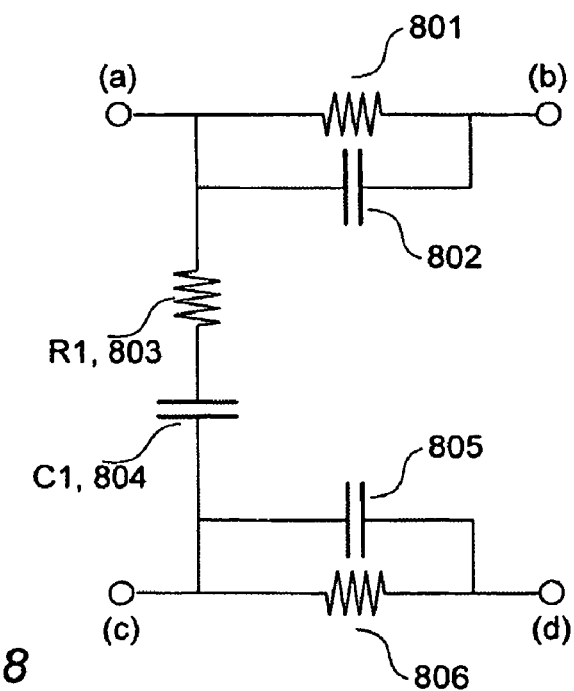

FIG. 8 shows a four-port band-stop feedback network providing in an amplifier a band-pass filter function. The feedback network comprises ports (a), (b), (c) and (d). Feedback paths from (b) to (a) and from (d) to (c) are established by capacitor 802 coupled in parallel with resistor 801, respectively capacitor 805 coupled in parallel with resistor 806.

Between the ports (a) and (c) a series connection of a capacitor and a resistor is established by C1, 804 and R1, 803. This series connection connects the inputs of the amplifier sections 301 and 302.

However, it should be noted that other feedback filter configurations can be provided comprising active filters and/or higher order filters.

Figure 9:
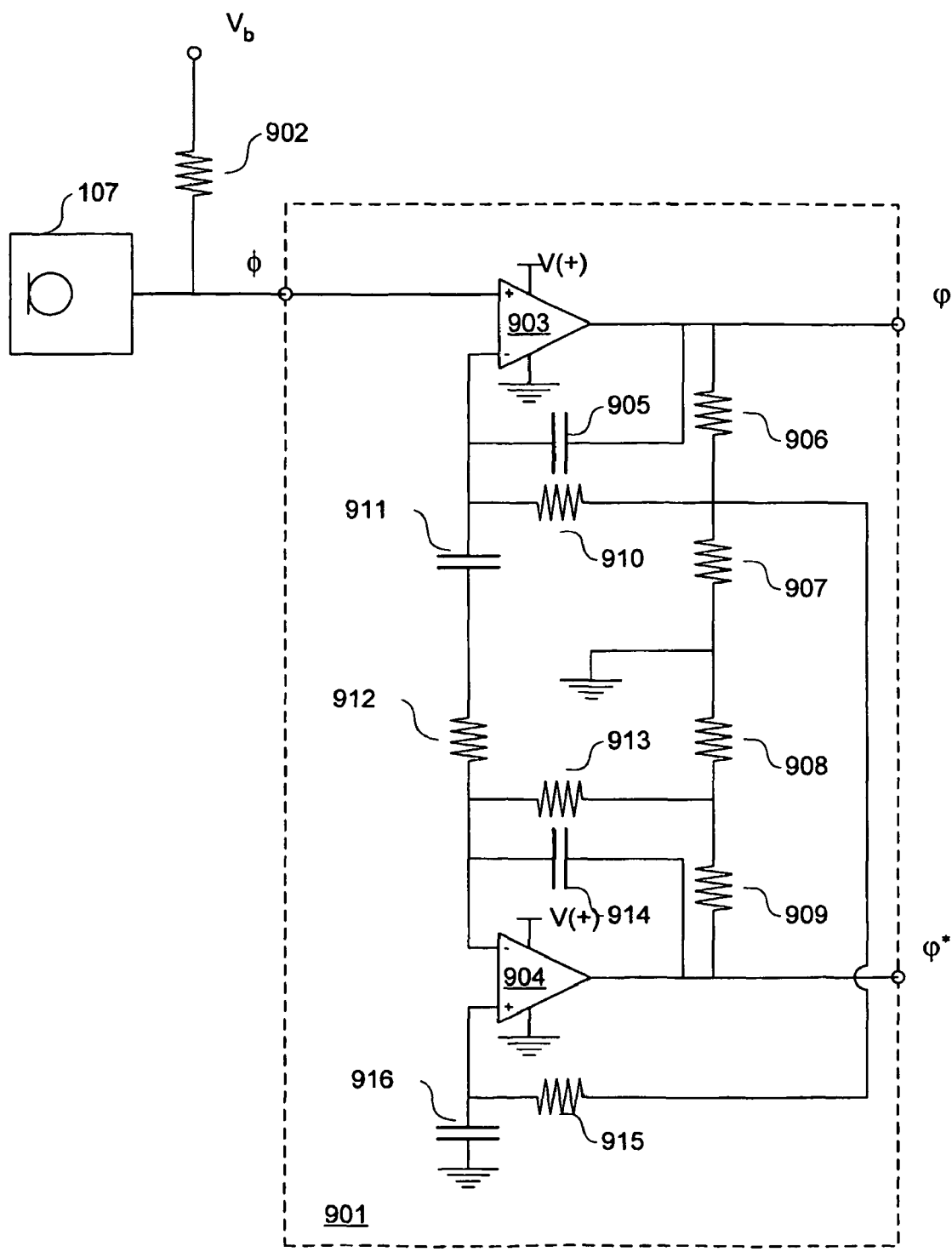
FIG. 9 shows in greater detail a preamplifier with a differential mode band-pass filter function and a common-mode low-pass filter function.

FIG. 9 shows in greater detail a preamplifier with a differential mode band-pass filter function and a common-mode low-pass filter function. The preamplifier 901 comprises an AC feedback network, corresponding to the one shown in FIG. 8, and a phase-shifter network, corresponding to the one shown in FIG. 5 in a configuration as shown in FIG. 4. The feedback network and the phase-shifter establish a differential mode high-pass filter function. Integrated therewith, a DC feedback network provides a common mode low-pass filter function, which provides a definite common-mode gain for DC and low frequencies. The preamplifier is configured such that the impedance of the DC feedback network dominates at DC (low frequencies) whereas the impedance of the AC feedback network dominates at higher frequencies. Thereby the DC level at which the differential signal is provided can be controlled with very limited circuitry while a desired AC filter function is realized.

A reference DC voltage level, Vb, is applied to the input of the preamplifier which by means of its common-mode definite DC gain establishes a definite DC level at which the differential signal is provided.

The input, φ, of the preamplifier 901 is coupled to the microphone circuit 107 and a controlled DC voltage level is applied to the input via a resistor Rb, 902 by means of a voltage source (not shown). This DC voltage level is set in accordance with a desired common-mode DC output level and the common-mode DC gain of the preamplifier. To this end it should be noted that the power supply to a microphone typically is single ended i.e. between the nominal power supply voltage level, $V_{dd}$, and a ground reference. In order to provide a symmetrical limitation of the AC output swing at differential-mode, the common-mode DC output level should be close to half of the nominal power supply voltage. Thereby, a maximum differential-mode AC voltage swing is achievable. Special emphasis is given to this aspect as this limitation is the most restrictive for obtaining a large AC gain. Further, since noise in the digital microphone signal decreases as the preamplifier gain increases, a large preamplifier gain (and in turn room for a large AC voltage swing) is preferred. It should be noted that a larger AC signal swing improves signal-to-noise ratio since the noise from the sigma-delta converter is constant in respect of different amplitudes.

Since, typically, the input stage of a preamplifier saturates if it is exposed to input DC levels which are relatively large compared to the supply voltage, the output DC level must be achieved by a DC preamplifier gain of more than 0 dB.

If for instance the nominal power supply voltage level is 1.5 volts, the common-mode DC output level should be approximately half of 1.5 volts, equal to 0.75 volts. For a power supply voltage of 1.5 volts and a typical input stage of the PMOS differential pair type, the input should be able to handle an input DC voltage level of up to approximately 0.4 volts. In order to set the DC level at the output, the DC gain should be at least about two times. A DC output level of 0.75 volts and a DC gain of two times would require a DC reference voltage Vb equal to 0.375 volts which is less than 0.4 volts.

The preamplifier is implemented as a differential preamplifier made from two operational amplifiers 903 and 904.

The DC gain of the differential preamplifier is realized by a DC feedback network around each of the two operational amplifiers. The DC feedback network senses the respective output signal by means of a voltage divider. The voltage divider is implemented by means of resistors 906 and 907 for the operational amplifier 903 and by means of resistors 909 and 908 for the operational amplifier 904.

The AC feedback network is configured as it is shown in FIG. 8. Since however, it is integrated with the DC network, the resistive feedback path of the AC network comprises the resistors 910 and 906 and resistors 909 and 913 for amplifiers 903 and 904, respectively. The capacitors 905 and 914 are coupled in parallel with the resistive feedback paths. The capacitor 911 and the resistor 912 are coupled in series between the inverting inputs of the amplifiers 903 and 904.

The phase-shifter is configured as shown in FIG. 5. Since however, it is desired to integrate it with the DC network, it receives its input from the circuit node established by the voltage divider 906 and 907.

At DC the impedance of the DC feedback network dominates. Thus, looking at a DC equivalence diagram, the voltage provided by voltage divider 906, 907 is virtually identical to the voltage fed back to inverting input of the amplifier 903. Consequently, the DC gain of amplifier 903 is determined by the voltage divider. A DC gain of two times is achieved e.g. by two 100 KOhm resistors. Likewise, the DC gain of the amplifier 904 is determined by the resistors 909 and 908. This DC gain is selected to match that of the amplifier 903.

Further, to force the amplifier 904 to provide an output voltage at the same level as that of the amplifier 903, the resistor 912 of the phase-shifter is coupled to the circuit node established by the voltage divider 906, 907. Thereby, the output level of amplifier 904 follows the output level of amplifier 903.

As an alternative embodiment, the DC offset or DC bias can be introduced in the input stage of the amplifier 903 e.g.

by shifting the source voltage level (and consequently the gate and drain voltage) of a differential pair PMOS devices in the input stage. This embodiment can be based on DC and AC feedback networks similar to the ones described above. In this case $V_b$ is connected to ground in order to set the DC bias level. It should be noted that combinations of the two configurations is also possible.

At AC the impedance of the AC feedback network dominates. Thus, looking at an AC equivalence diagram, the feedback filter and the phase-shifter operates as described in connection with FIGS. 4, 5 and 8. However, it is recalled that the phase-shifter network comprising resistor 512 and capacitor 513 is configured to provide a gradually shifting phase of the signal input to the phase-shifter. This ensures that the preamplifier provides a common-mode output signal at low frequencies, including DC, and a differential mode signal at higher frequencies, including the audio band and frequencies above the audio band.

The phase shift between the one side, constituted around operational amplifier 903, of the differential amplifier and the other side, constituted around operational amplifier 904 is implemented by capacitor 916 and resistor 915. Thus, the phase shift is obtained by a phase shifter. It should be noted that the resistor 915 in series with the capacitor 916 establishes a pole ($F_{P2}$) and a zero ($F_{Z1}$) confer the following.

Figure 10:
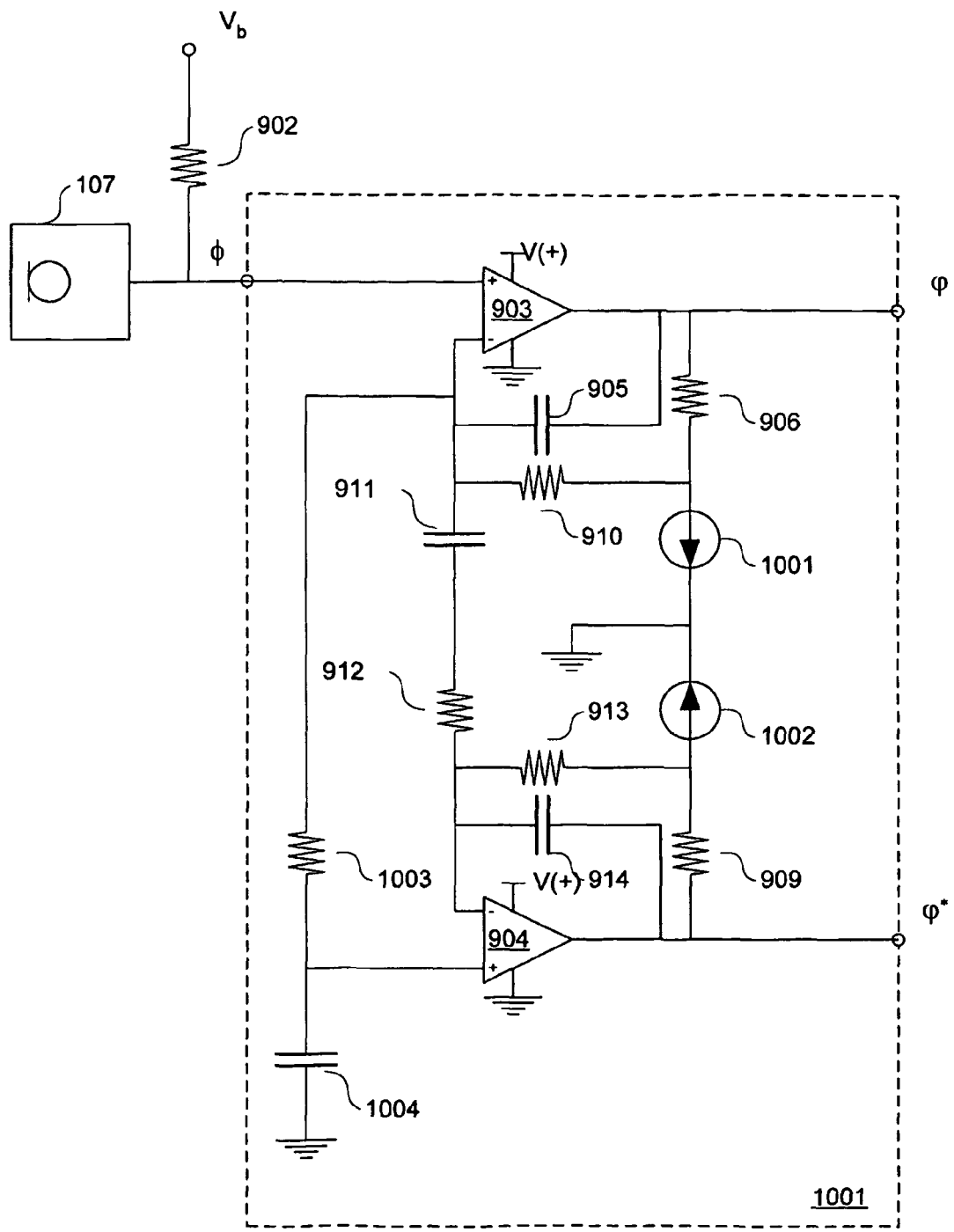
FIG. 10 shows a preamplifier with a differential mode band-pass filter function and a common-mode low-pass filter function, where a differential DC shift is provided.

FIG. 10 shows a preamplifier with a differential mode band-pass filter function and a common-mode low-pass filter function, where a differential DC shift is provided. In the configuration of a preamplifier described in connection with FIG. 9, the common-mode DC output is provided by a DC voltage reference provided either at the input terminal of the preamplifier or at the input stage of one or both of the operational amplifiers 903, 904. In combination therewith the common-mode DC output is determined by the DC voltage reference and the common-mode DC gain of the preamplifier.

The preamplifier 1001 shown in FIG. 10 however, provides the common-mode DC shift by means of two active current sources 1001 and 1002. Additionally, a differential-mode DC shift is provided by a difference in the currents drawn by the two current sources. Since a sigma-delta converter is coupled to detect the differential signal provided by the preamplifier 1001, the idle mode tones can be controlled by the differential-mode DC shift provided in the preamplifier.

When the DC shift is provided by the active current sources 1001, 1002 irrespective of whether it is a differential-mode or common-mode DC shift or both, the input terminal should be set to a reference level e.g. by coupling the input to ground via the resistor 902 (i.e. $V_b$=0 Volts; however for practical implementations $V_b$ should be at least about 100 mV). However, it is an option to apply another DC reference in combination with the active current sources.

If for instance the power supply voltage $V_{dd}$ is single-ended 1.5 volts and the reference $V_b$ is set to 0 Volts, a common-mode DC voltage of $\frac{1}{2}V_{dd}$=0.75 volts can be achieved by drawing a DC current through resistor 906 which establish a DC voltage of 0.75 volts across it. Say resistor 906 has a value of 100 KOhms, a current of 7.5 μAmps will provide the desired DC voltage at the output (output terminal φ).

Further, if it is desired, with respect to optimization of the idle mode tones, to establish a differential-mode DC shift of 15 mVolts and the resistor 909 has a value substantially equal to its counter part 906, a current of 7.35 μAmps will provide a DC voltage at the output of the amplifier 904 (output terminal φ*) of 0.735 volts. Thus establishing a differential-mode DC output of 15 mVolts as desired.

From an AC point of view, the phase-shifter, PD(f) is established by means of resistor 1003 and capacitor 1004 as shown in FIG. 5 and it is embedded in the preamplifier as shown generally in FIG. 3. Thus, the resistor 1003 is coupled to the inverting terminal of the operational amplifier 903 and to the non-inverting input of the operational amplifier 904. The capacitor 1004 is coupled between the non-inverting input of amplifier 904 and the ground reference.

The preamplifier is thereby coupled to provide a common-mode DC level for maximization of the output AC voltage swing and a differential-mode DC level for control of idle-mode tones while at AC low frequency output signals are forced to appear as a common-mode signal and at higher frequencies the output signal is forced to appear as a differential mode signal.

In an alternative embodiment, the differential-mode DC shift can be realized by means of a voltage divider coupled between the output terminal, φ, and ground. The voltage divider provides a divided output voltage at a circuit node to which the resistor 1003 is coupled instead of being coupled to the inverting input of amplifier 903.

Figure 11:
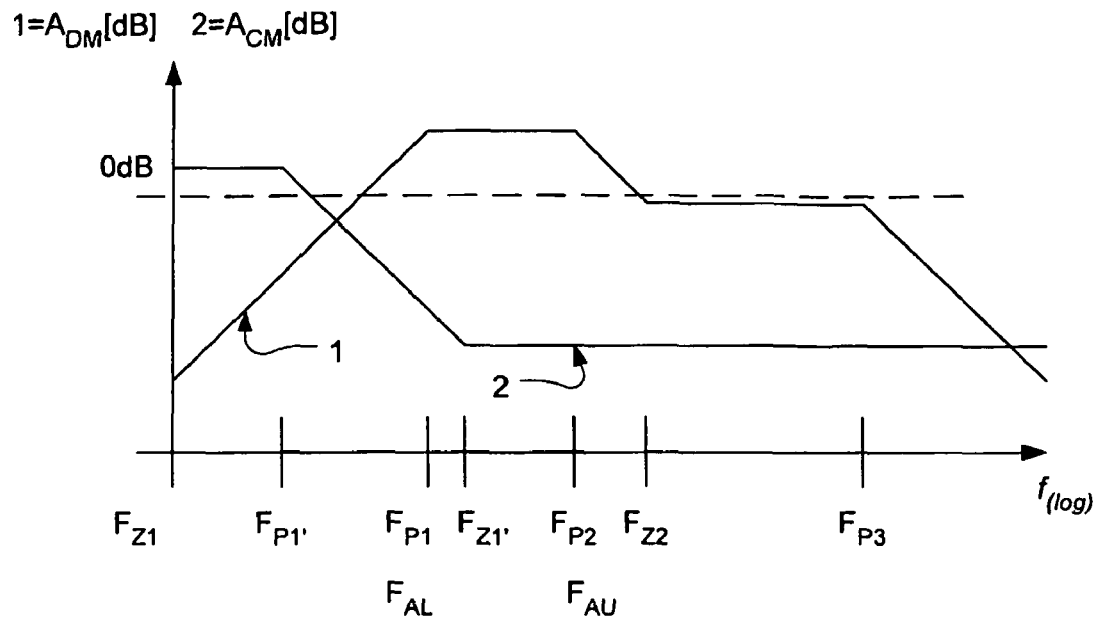
FIG. 11 shows a first frequency-gain transfer function of a preamplifier.

FIG. 11 shows a first frequency-gain transfer function of a preamplifier. The frequency-gain is shown for the preamplifier as it is acting in common-mode ($A_{CM}$=curve 1) and differential mode ($A_{DM}$=curve 2). The response is shown as a straight line approximation on a logarithmic frequency axis and a logarithmic gain axis.

Curve 2 illustrates the common-mode operation. From DC and up to the location of the pole $F_{P1'}$ a flat response is provided. This flat response provides typically a gain of or above 0 dB, but the amount of gain depends on which embodiment of the DC off-set that is chosen and the desired DC level. Above $F_{P1'}$, up to $F_{Z1'}$ the response passes over to a lower gain level. This lower gain level is flat above $F_{Z1'}$. This common-mode response is provided by the phase-shifter shown in FIG. 5 when it operates in combination with the preamplifier.

Curve 1 illustrates the differential-mode operation. At DC at least one pole establishes a positive slope of the transfer function which continues up to the location of the pole $F_{P1}$. Thereby differential mode DC signals are effectively suppressed. From the pole $F_{P1}$ to the pole $F_{P2}$, a flat response is provided. Preferably the audio band is comprised by the frequency range of this flat response. Above $F_{P2}$ and up to $F_{Z1}$ the response passes over to a lower gain plateau. The purpose of the gain plateau is to suppress noise sources above the audio band e.g. sound noise, electronic noise and to diminish gain effects of resonance peaks of the microphone element. The level of the gain plateau is determined such that the noise sources and gain effects do not limit the output swing (gain) of the preamplifier. At the pole $F_{P3}$ the gain function begins to descent for higher frequencies. The pole $F_{P3}$ may be designed to be located about a pole introduced by the operational amplifiers as such or the pose $F_{P3}$ may be introduced by the operational amplifiers as such.

The series resistor C1, 702; 804 in the feedback network introduces the pole-zero pair ($F_{P2}$, $F_{Z2}$). This pole-zero pair is typically located about 50-60 KHz and establishes the gain plateau from $F_{Z2}$ to $F_{P3}$ located about 500 KHz where the amplifier itself introduces at least one pole and thereby a negative slope.

The audio band is illustrated by means of a lower corner frequency $F_{AL}$ and an upper corner frequency $F_{AU}$.

Figure 12:
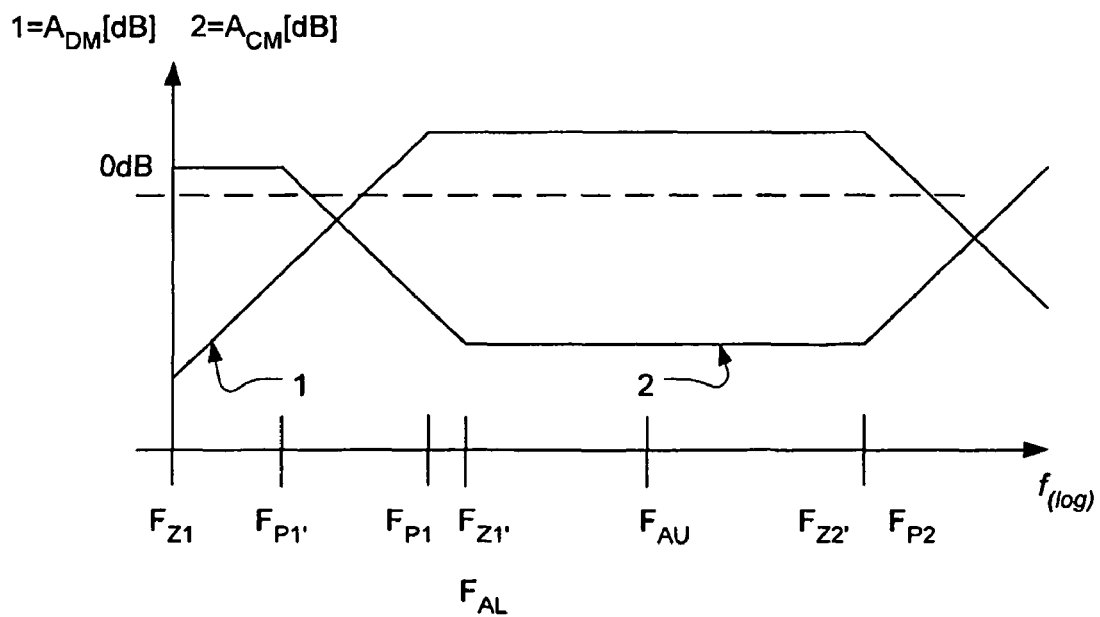
FIG. 12 shows a second frequency-gain transfer function of a preamplifier.

FIG. 12 shows a second frequency-gain transfer function of a preamplifier. Again, the frequency-gain is shown for the preamplifier as it is acting in common-mode ($A_{CM}$=curve 1) and differential mode ($A_{DM}$=curve 2).

Curve 2 illustrates the common-mode operation. The common-mode transfer function behaves like shown in FIG. 11, but for frequencies above the transfer function zero $F_{Z2'}$. Above $F_{Z2'}$ a positive slope begins. This ensures that the preamplifier starts to act as a common-mode amplifier for frequencies above $F_{Z2'}$. Thereby the suppression of signal components in the upper stop band of the differential mode band-pass filter is further suppressed by the gradually prevailing common mode operation. This common-mode response is provided by the phase-shifter shown in FIG. 6 when it operates in combination with the preamplifier.

Curve 1 illustrates the common-mode operation. This transfer function illustrates a true band-pass filter function without the gain plateau introduced by the series resistor R1, 702; 803 in the feedback network of the preamplifier.

Figure 13:
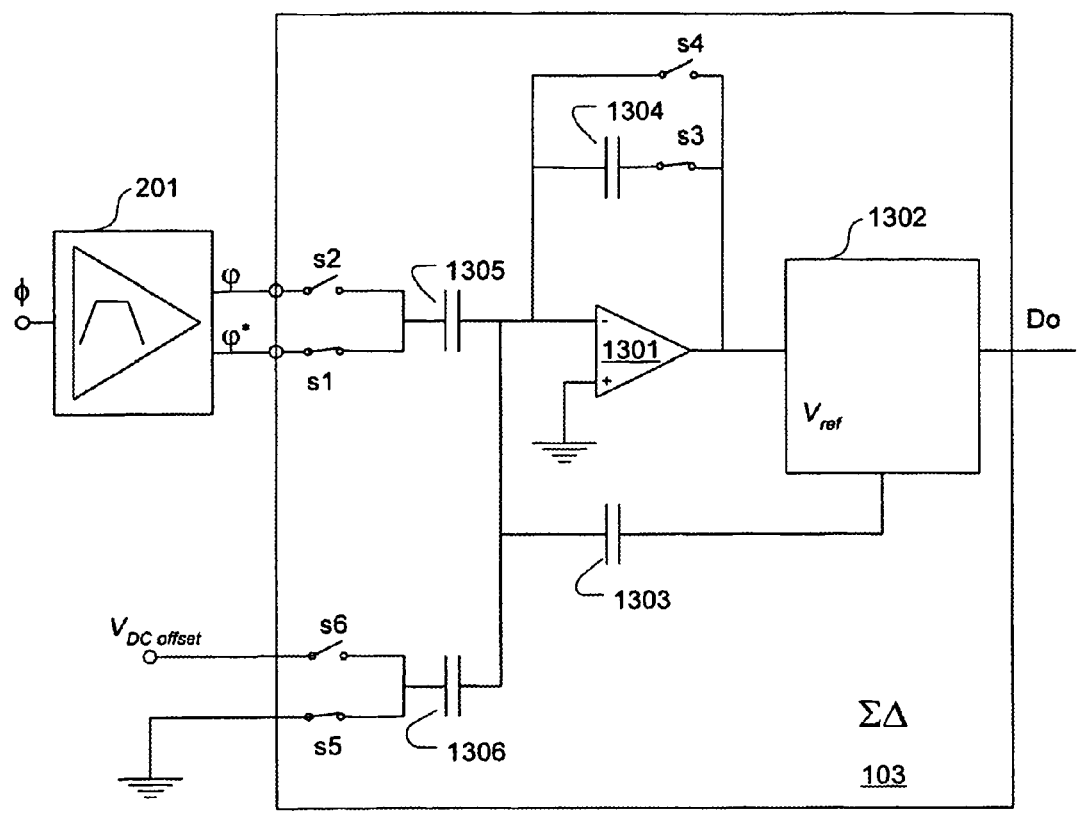
FIG. 13 shows a differential preamplifier followed by a switch-capacitor; sampler integrated with a sigma-delta converter.

FIG. 13 shows a differential preamplifier followed by a switch-capacitor sampler integrated with a sigma-delta converter. The differential preamplifier 201 receives a microphone signal at its input φ and provides the dual outputs φ and φ*. The signal from the preamplifier provided by means of these outputs is sampled differentially by means of a switch-capacitor detector integrated with the sigma-delta converter 103. The switch-capacitor detector is build around an operational amplifier 1301. The differential sampling is realized by an input series capacitor 1305 and a feedback capacitor 1304 which are coupled between two circuit configurations by means of switches S1-S4.

The input series capacitor 1305 is, at its input side, connected to the outputs φ and φ* of the preamplifier by means of respective switches S1 and S2. The feedback capacitor 1304 is coupled as a feedback path by means of switch S3. The switch S4 is coupled in parallel with the series connection of the capacitor 1304 and the switch S3.

The switches S1-S4 are controlled to be either closed or open according to the scheme shown in the bottom right corner i.e. switches S1 and S3 operate in unison and the switches S2 and S4 operate in unison, but 180 degrees phase shifted relative to S1 and S3. The switches S1-S4 are controlled by means of a clock frequency e.g. the sampling frequency of the sigma-delta converter. A switch-capacitor sampling of differential signals is known to a person skilled in the art and will not be described in greater detail, but it is shown to illustrate interconnection of the differential preamplifier and the sigma-delta converter.

It should be noted that the amplifier 1301 is coupled by means of capacitor 1303 to realize the summing amplifier of the sigma-delta feedback loop. A person skilled in the art will know how a sigma-delta modulator in general is configured. The skilled person will know that the summing amplifier compares the input signal to a feedback signal obtained from the quantizer that provides the digital output signal $D_O$. Output of the summing amplifier is coupled to an integrator (irrespective of its order) which provides its output signal to the quantizer. The feedback signal is provided to the summing amplifier 1301 by means of the capacitor 1303.

In addition to switched capacitor sampling of a differential signal, an embodiment of a DC shift is realized. This embodiment of a DC shift is an alternative to the differential DC shift provided in the preamplifier and is configured to control idle mode tones of the sigma-delta converter.

The DC shift can at this stage of the digital microphone be implemented as a single-ended DC shift. It is implemented by sampling a DC voltage reference $V_{DC\ offset\ \tau\Delta}$ by means of a series capacitor 1306 which is alternately coupled to either the DC voltage reference or to a ground reference. The capacitor is alternately coupled by means of switches S5 and S6. The switching scheme for the switches S5 and S6 is controlled by a logic network coupled to the output of the quantizer in the sigma-delta converter.

In this illustration an anti-aliasing filter is implemented by means of the upper cut-off frequency implemented by the band-pass filter of the preamplifier. It is required to remove spectral components above a sampling frequency of the converter.

Thus, the summing amplifier can be provided with an integration error feedback signal of the sigma-delta modulator via a first series capacitor and the DC voltage level is provided to the summing amplifier via a second series capacitor. Thereby the idle mode tones can be controlled by the ratio between the values of the first and second series capacitor. The location of the idle mode tone is determined by the expression $$F_{idle} = (V_{DC\ offset\ \Sigma\Delta}/V_{REF\ \Sigma\Delta}) * (C_{1306}/C_{1304}) * \tfrac{1}{2}F_S$$

where $F_{idle}$ is the location of the idle mode tone, $C_{1306}$ and $C_{1304}$ are the values of the first and second capacitor, $F_S$ is the sampling frequency, $V_{DC\ offset\ \tau\Delta}$ is the sampled DC voltage and $V_{REF\ \Sigma\Delta}$ is an internal reference of quantizer in the sigma-delta modulator.

When the analogue-to-digital converter comprises a sigma-delta modulator, and when a DC off-set voltage level input to the sigma-delta modulator is chosen such that a low-frequent pulse input to and processed by the preamplifier provides idle-mode tones above the audio band, a substantial reduction of non-linear distortion in a digital microphone is achieved. The DC off-set voltage level is provided by the preamplifier as a differential mode DC signal or by the sampler as described above. The temporal duration of the pulse response of the combination of the microphone circuit and the preamplifier is limited by the high-pass filter function of the preamplifier, this further reduces the sensitivity to generation of idle mode tones.

Figure 14:
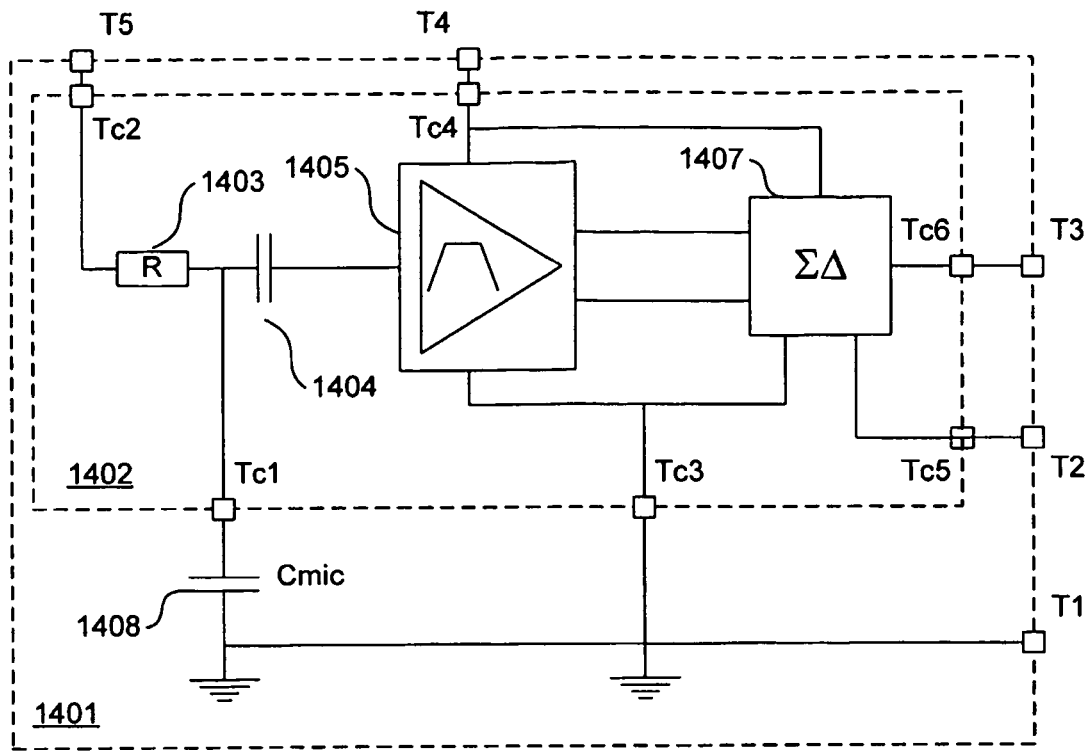
FIG. 14 shows a first configuration of a digital microphone.

FIG. 14 shows a first configuration of a digital microphone. For a condenser microphone implementation, the digital microphone is enclosed by a capsule 1401 which encloses an integrated circuit in the form of a chip 1402. The chip 1402 comprises terminals Tc1, Tc2, Tc3, Tc4 for coupling to the microphone element 1408, the bias voltage, a ground reference potential and a supply voltage, respectively. Terminal Tc6 provides the digital microphone output signal, $D_O$, from the A/D converter. Via terminal Tc5 a clock signal is provided to the A/D converter. The power supply voltage to the amplifier 1405 and the A/D converter can be provided via the terminal Tc6, in which case the terminal Tc4 can be omitted.

For the condenser microphone capsule implementation the microphone element 1408 is a condenser microphone which requires a DC bias supply to provide the proper electrical charge on one of the microphone members. This DC bias is provided via resistor 1403. A DC blocking capacitor 1404 prevents the DC bias level from reaching the input stage of the preamplifier 905. In an alternative embodiment the microphone element 1408 is an Electret Condenser Microphone, ECM. Thereby the microphone element 1408 is coupled directly to the input of the preamplifier 1405 and the bias resistor and the DC blocking capacitor is not needed.

For a Micro Electro Mechanical System, MEMS, implementation the digital microphone is implemented as a MEMS device which comprises a micro electro circuit portion and a micro mechanical portion, which implements the microphone element 1408. For a circuit perspective the microphone element changes circuit position with the DC blocking capacitor. The micro electro circuit portion or the chip unit, as the case may be, comprises a preamplifier 1405 with a band-pass filter function and an A/D converter 1407.

Figure 15:
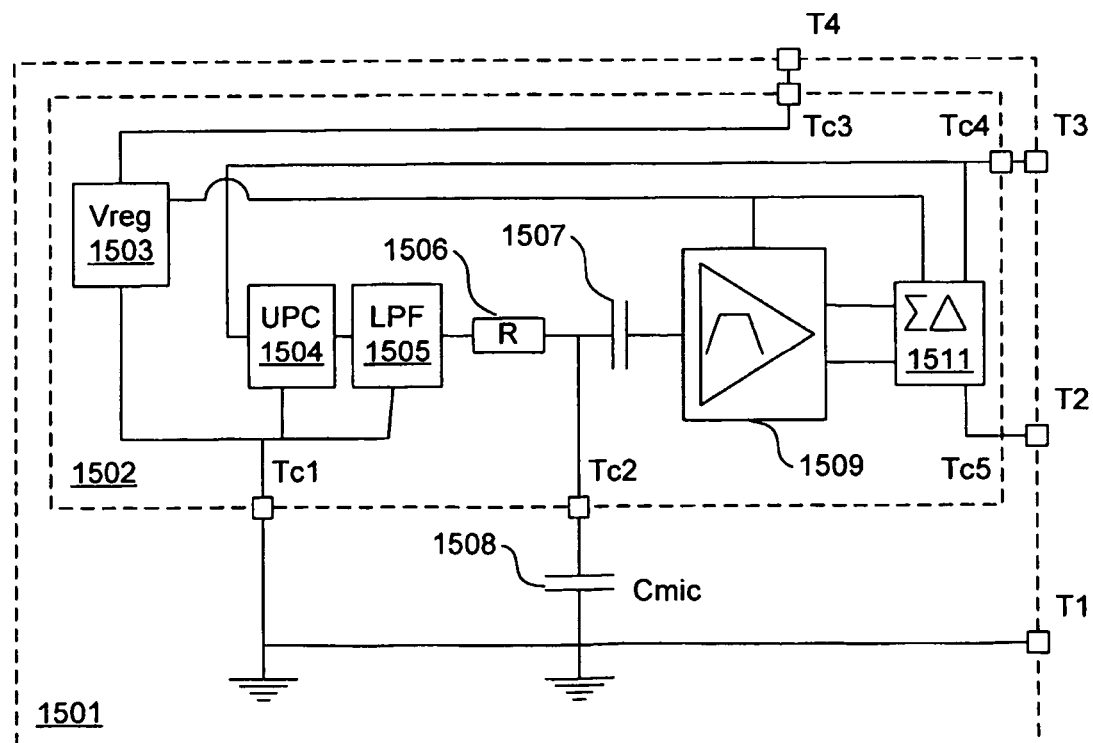
FIG. 15 shows a second configuration of a digital microphone.

FIG. 15 shows a second configuration of a digital microphone. It should be noted that the below description applies to an implementation of the digital microphone by means of a chip and a condenser microphone. However, based on the description given in connection with FIG. 14 a person skilled in the art will be able to realize a MEMS implementation.

The digital microphone 1501 comprises an integrated circuit 1502 with a DC voltage regulator 1503 which provides a regulated voltage to the amplifier 1509 and the sigma-delta converter 1011. The microphone bias voltage is provided by an on-chip voltage up-converter 1504 which receives an off-chip oscillating signal with a voltage amplitude; in response thereto the up-converter provides an output oscillating signal with a larger voltage amplitude. This output signal is low pass filtered by low pass filter 1505 and is provided via a series resistor 1506 to the microphone element 1508. A capacitor 1507 blocks the DC bias voltage from reaching the input of the preamplifier 1509 with the transfer function mentioned above. Output of the preamplifier 1509 is provided to a sigma-delta converter 1511.

The voltage up-converter or voltage pump, UPC, 1004 can be in the form of a so-called Dickson-converter. The voltage pump is operated by an oscillator which preferably provides a square-wave oscillator signal to the voltage pump. Other signals, eg sine waves or filtered square waves, with lower contents of harmonics may be used to obtain lower noise. In an alternative embodiment, the oscillator is embedded on the chip 1502.

It is shown that the up-converter and the sigma delta converter shares the same oscillator/clock signal as provided via terminal Tc4. It should be noted that the signal may be divided to obtain different oscillating/clock signal frequencies to the UPC and sigma-delta converter.

Figure 16:
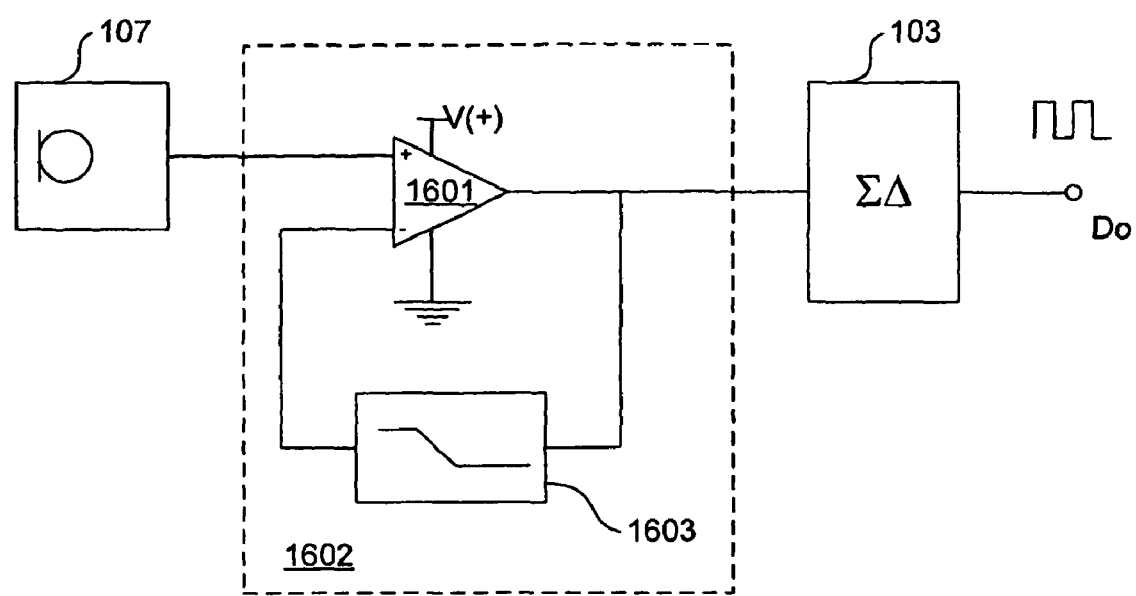
FIG. 16 shows a single-ended preamplifier with a filter function and an analogue-to-digital converter.

FIG. 16 shows a single-ended preamplifier and an analogue-to-digital converter. In this embodiment the microphone circuit 107 provides a signal to the single-ended preamplifier 1602. The output of the preamplifier 1602 is provided to an analogue-to-digital converter 103 of the sigma-delta modulator type.

The preamplifier 1602 comprises an amplifier section 160. Preferably, this amplifier section is an operational amplifier with a differential input. The amplifier section receives the signal from the microphone circuit 107 on its non-inverting input (+), whereas a feedback filter 1603 receives a the output signal from the amplifier section 1601 and provides a feedback signal at the inverting input (−) of the amplifier section 1601.

The frequency-gain characteristic of the feedback filter 1603 has a low-pass characteristic which in turn realizes a high-pass filter characteristic of the preamplifier with the feedback filter. Preferably, the pass-band (low frequencies) of the feedback filter provides a substantial flat gain response towards DC. And for higher frequencies, above its gain transition band, a flat response for higher frequencies. This is illustrated by the feedback filter.

However, the frequency-gain transfer function can be configured in line with the transfer functions of the differential amplifier with the necessary changes.

Figure 17:
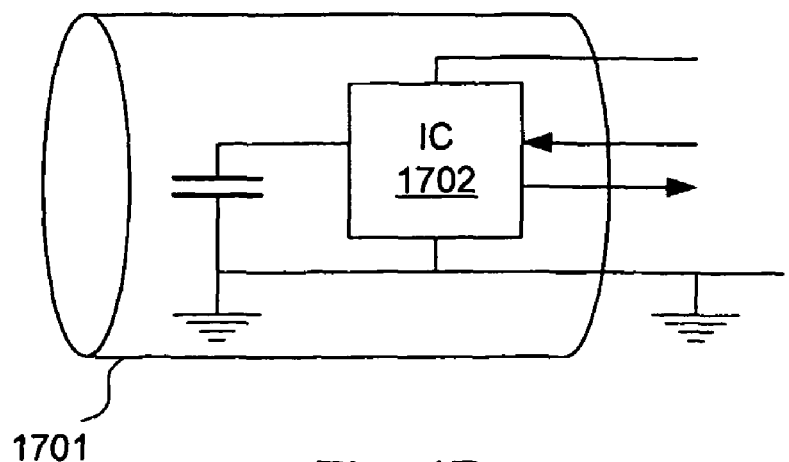
FIG. 17 shows a schematic view of a microphone with an integrated circuit and a microphone element.

FIG. 17 shows a schematic view of a microphone with an integrated circuit and a microphone element. The microphone is shown as a cartridge with a microphone member, comprising the microphone membrane and an integrated circuit.

Figure 18:
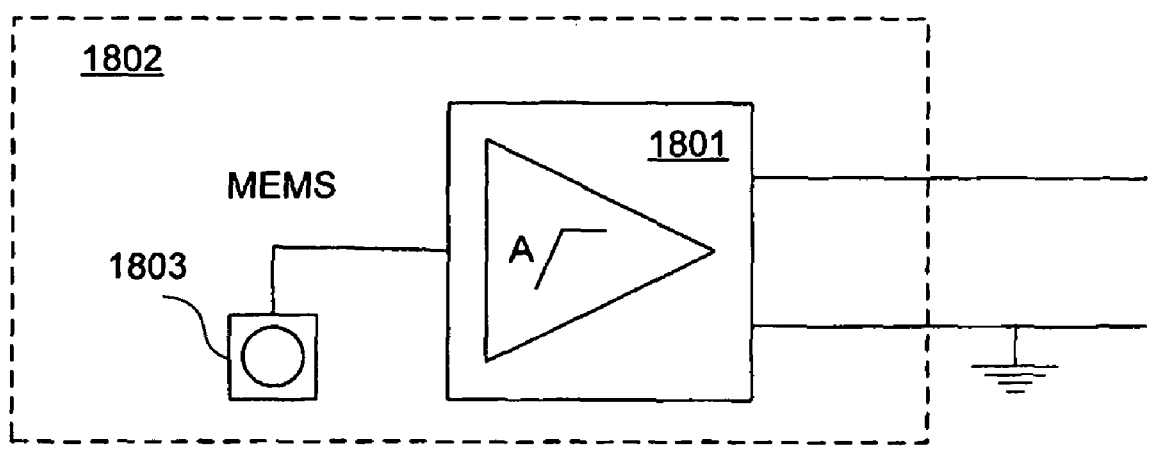
FIG. 18 shows a schematic view of a microphone with an integrated circuit and a MEMS microphone element.

FIG. 18 shows a schematic view of a microphone with an integrated circuit and a MEMS microphone element. The microphone 1902 comprises a MEMS microphone member 1903 integrated on a first substrate and the preamplifier circuitry 1901 integrated on a second substrate. The preamplifier circuitry comprises one of the different embodiments disclosed above i.e. comprising a preamplifier with a feedback circuit and e.g. a voltage pump and/or a feedback circuit, where the preamplifier is a differential amplifier or a single-ended amplifier.

It should be noted that the MEMS microphone member 1903 and the microphone preamplifier 1901 can be integrated on a single semiconductor substrate.

Generally it should be noted that the preamplifier can be implemented as a single-ended amplifier, a differential amplifier or other amplifier types such as a differential difference amplifier. In case preamplifiers with several inputs and outputs are used different realisations of multiple feedback filter paths are possible to realize a desired frequency transfer function.

A condenser microphone consists of a very light diaphragm and back plate to which is applied a polarizing voltage. Thereby a constant charge (for relevant frequencies is provided). The principle of operation is that sound waves impinging on the diaphragm cause the capacitance between it and the back plate to change in sympathy. This in turn induces an AC voltage on the back plate.

The electret condenser microphone, ECM, operates in a similar manner except that it has a permanent charge voltage implanted in an electret material to provide the polarizing voltage. This can be effected in three ways, the most common being when the diaphragm is the electret material, in this case one side is metalized. This is known as the foil or diaphragm type. The electret material does not make the best diaphragm and where higher performance is required the diaphragm is made of other material and the electret material applied to the back plate. This is known as the back type. A more recent variation is the so called front type. Here the electret material is applied to the inside of the front cover of the microphone and the metalized diaphragm connected to the input of the preamplifier.

The audio band can be defined to be any band within the typical definition of an audio band. A typical definition can be 20 Hz to 20 KHz. Exemplary lower cut-off frequencies for an audio band can be: 20 Hz, 50 Hz, 80 Hz, 100 Hz, 150 Hz, 200 Hz, 250 hz. Exemplary upper corner frequencies of the an audio band could be 3 KHz, 5 KHz, 8 KHz, 10 KHz, 18 KHz, 20 KHz. By substantial flat is meant gain response variations within approximately +/−1 dB; +/−3 dB; +/−4 dB; +/−6 dB. However, other additional values of variation can be used to define the term 'substantial flat'.

In the above different preamplifier configurations have been disclosed. These configurations comprise different input/output terminal configurations e.g. a two-terminal configuration. However, it should be noted that three, four or more terminals can be provided for input/output of signals to microphone and preamplifier. Especially, it should be noted that separate terminals can be provided for supply voltage (at a first terminal) and preamplifier output (at a second terminal). In case of a differential preamplifier output two terminals for the output signals can be provided in addition to a terminal for power supply. A separate terminal is provided for a ground reference. This ground reference is typically, but not always, shared by the power supply and output signal.

The invention claimed is:

1. An integrated circuit, configured to process microphone signals, where the integrated circuit comprises:
a preamplifier with an amplifier section which has a differential input comprising a first input (+) and a second input (−) and an output (φ; φ*), and with a feedback filter network coupled between the output (φ; φ*) and the second input (−); where the first input (+) to the amplifier section is coupled to an input (φ)) of the preamplifier for receiving a microphone signal; and where the preamplifier has a frequency-gain transfer function which suppresses low frequencies in a stop band relative to higher frequencies in a pass band; and where the preamplifier is configured to provide a common-mode differential output signal in the stop band and a differential-mode differential output signal in the pass band; and an analogue-to-digital converter coupled to receive the differential output signal, as an anti-aliasing filtered signal, from the preamplifier and to provide a digital output signal.

2. An integrated circuit according to claim 1, where the preamplifier is configured to provide a differential output signal ($\phi$, $\phi^*$) by a first and a second amplifier section, where the preamplifier has a differential mode transfer function which comprises a band-pass characteristic ($A_{DM}$), and where the preamplifier comprises a feedback filter network which establishes filter feedback paths (a-b; c-d) which couple outputs to respective inverting inputs of the amplifier sections, and which establishes a filter interconnection path (a-c), which interconnects the inverting inputs.

3. An integrated circuit according to claim 1, where a lower cut-off frequency ($F_{P1}$) of the filter realized by the preamplifier is located below the lower corner frequency of an audio band.

4. An integrated circuit according to claim 1, where the preamplifier has a differential mode transfer function ($A_{DM}$) which comprises a band-pass characteristic with an upper cut-off frequency ($F_{P3}$; $F_{P2}$) located below half the sampling frequency ($F_S$) of the analogue-to-digital converter.

5. An integrated circuit according to claim 1, where the preamplifier has a differential mode transfer function ($A_{DM}$) which comprises a band-pass characteristic, which has a nominal pass-band ($F_{P1}$-$F_{P2}$) and a gain plateau band ($F_{Z2}$-$F_{P3}$), where the nominal pass-band extends over audio band frequencies and where the gain plateau band extends over frequencies above the audio band up to an upper cut-off frequency ($F_{P3}$).

6. An integrated circuit according to claim 1, where the preamplifier has a common-mode transfer function ($A_{CM}$) which comprises a low-pass characteristic.

7. An integrated circuit according to claim 1, where the preamplifier has a common-mode transfer function ($A_{CM}$) which comprises a stop-band characteristic ($F_{Z1'}$; $F_{Z1'}$-$F_{Z2'}$), and where a flat gain response is provided for low frequencies (DC-$F_{P1'}$).

8. An integrated circuit according to claim 1, where the preamplifier has a common-mode transfer function ($A_{CM}$) and a differential mode transfer function ($A_{DM}$) which are configured such that its common-mode gain ($A_{CM}$) prevails at low frequencies (DC-$F_{P1'}$) whereas its differential mode gain ($A_{DM}$) prevails at audio band frequencies ($F_{AL}$-$F_{AU}$).

9. An integrated circuit according to claim 1, where additionally the common-mode gain ($A_{CM}$) prevails at frequencies above an upper cut-off frequency ($F_{P2}$, $F_{P3}$) of the band-pass characteristic.

10. An integrated circuit according to claim 1, where a phase-shifter is cross-coupled between the output of a first amplifier section and an input of a second amplifier section.

11. An integrated circuit according to claim 1, where a phase-shifter is coupled between respective inputs (−) of the respective amplifier sections.

12. An integrated circuit according to claim 1, where the preamplifier comprises a DC off-set circuit integrated with the feedback filter (Z1; Z1,Z1*,Z2) to provide a DC shift at the output of the preamplifier.

13. An integrated circuit according to claim 1, comprising a DC off-set circuit integrated with the feedback filter and configured to provide a differential mode DC shift at the output of the preamplifier.

14. An integrated circuit according to claim 1, where the analogue-to-digital converter comprises a sigma-delta modulator.

15. An integrated circuit according to claim 14, where the sigma-delta modulator comprises a switch-capacitor sampler, which samples the differential signal ($\phi$, $\phi^*$) provided by the preamplifier to provide a single ended input signal for the sigma-delta A/D conversion, and samples a DC voltage level ($V_{Ref\Sigma\Delta}$) such that the single ended input signal is superimposed on the sampled DC voltage level.

16. An integrated circuit according to claim 15, where the sampler comprises a summing amplifier which is an integrated portion of the sampler and the sigma-delta modulator loop.

17. An integrated circuit according to claim 16, where the summing amplifier is provided with an integration error feedback signal of the sigma-delta modulator via a first series capacitor and where the DC voltage level is provided to the summing amplifier via a second series capacitor.

18. An integrated circuit according to claim 1, where the analogue-to-digital converter comprises a sigma-delta modulator, and where a DC off-set voltage level input to the sigma-delta modulator is chosen such that a low-frequent pulse input to and processed by the preamplifier provides idle-mode tones above the audio band.

19. A microphone comprising an integrated circuit as set forth in claim 1 and further comprising a condenser microphone element configured to provide a microphone signal, responsive to a sound pressure on the microphone element, to the input ($\phi$) of the microphone preamplifier.

20. A microphone comprising an integrated circuit as set forth in claim 1 and further comprising a MEMS microphone element to provide a microphone signal, responsive to a sound pressure on the MEMS microphone element, to the microphone preamplifier.

* * * * *